United States Patent
Zhang et al.

(10) Patent No.: US 8,968,600 B2
(45) Date of Patent: **\*Mar. 3, 2015**

(54) LIGHT EMITTING COMPOSITE WITH PHOSPHOR COMPONENTS

(75) Inventors: Bin Zhang, San Diego, CA (US);
Amane Mochizuki, Carlsbad, CA (US);
Toshitaka Nakamura, Osaka (JP);
Guang Pan, Carlsbad, CA (US);
Hiroaki Miyagawa, Oceanside, CA (US); Hironaka Fujii, Carlsbad, CA (US)

(73) Assignee: Nitto Denko Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/402,668

(22) Filed: Feb. 22, 2012

(65) Prior Publication Data
US 2012/0218736 A1 Aug. 30, 2012

Related U.S. Application Data

(60) Provisional application No. 61/446,346, filed on Feb. 24, 2011.

(51) Int. Cl.
*C09K 11/77* (2006.01)
*E21B 41/00* (2006.01)
(Continued)

(52) U.S. Cl.
CPC ............. *E21B 41/00* (2013.01); *C09K 11/7774* (2013.01); *H01L 33/502* (2013.01);
(Continued)

(58) Field of Classification Search
USPC ........ 252/301.4 R, 301.4 F; 428/690; 427/64, 427/69, 157; 313/486, 487, 502, 503
See application file for complete search history.

(56) References Cited

U.S. PATENT DOCUMENTS 5,998,925 A 12/1999 Shimizu et al.
6,069,440 A * 5/2000 Shimizu et al. ............... 313/486
(Continued)

FOREIGN PATENT DOCUMENTS

CN 1 495 925 5/2004
DE 197 30 005 1/1999
(Continued)

OTHER PUBLICATIONS

International Search Report and Written Opinion for PCT/US2012/026189 mailed Apr. 23, 2012.
(Continued)

*Primary Examiner* — Carol M Koslow
*Assistant Examiner* — Lynne Edmondson
(74) *Attorney, Agent, or Firm* — Knobbe Martens Olson & Bear LLP

(57) ABSTRACT

Disclosed herein are phosphor compositions having high gadolinium concentrations. Some embodiments include a thermally stable ceramic body comprising an emissive layer, wherein said emissive layer comprises a compound represented by the formula $(A_{1-x-z}Gd_xD_z)_3B_5O_{12}$, wherein: D is a first dopant selected from the group consisting of Nd, Er, Eu, Mn, Cr, Yb, Sm, Tb, Ce, Pr, Dy, Ho, Lu and combinations thereof; A is selected from the group consisting of Y, Lu, Ca, La, Tb, and combinations thereof; B is selected from the group consisting of Al, Mg, Si, Ga, In, and combinations thereof; x is in the range of about 0.20 to about 0.80; and z is in the range of about 0.001 to about 0.10. Also disclosed are thermally stable ceramic bodies that can include the composition of formula I. Methods of making the ceramic body and a lighting device including the ceramic body are also disclosed.

21 Claims, 17 Drawing Sheets

X=3~35%, emissive layer thickness=78μm

| 0%Ce 100μm*2 |
| 0%CeX%Gd 100μm*2 |
| SSR 1.0CeXGd |
| 0%Ce25%Gd 100μm*2 |
| 0%Ce 100μm*2 |

(51) Int. Cl.

| | |
|---|---|
| *E21B 43/1185* | (2006.01) |
| *E21B 47/18* | (2012.01) |
| *B32B 18/00* | (2006.01) |
| *C04B 35/44* | (2006.01) |
| *C04B 35/50* | (2006.01) |
| *H01L 33/50* | (2010.01) |

(52) U.S. Cl.
CPC ........... *E21B43/11852* (2013.01); *E21B 47/18* (2013.01); *B32B 18/00* (2013.01); *C04B 35/44* (2013.01); *C04B 35/50* (2013.01); *C04B 2235/3217* (2013.01); *C04B 2235/3218* (2013.01); *C04B 2235/3224* (2013.01); *C04B 2235/3225* (2013.01); *C04B 2235/3229* (2013.01); *C04B 2235/5409* (2013.01); *C04B 2235/6025* (2013.01); *C04B 2235/6562* (2013.01); *C04B 2235/6565* (2013.01); *C04B 2235/6581* (2013.01); *C04B 2235/6586* (2013.01); *C04B 2235/764* (2013.01); *C04B 2235/9646* (2013.01); *C04B 2235/9653* (2013.01); *C04B 2237/343* (2013.01); *C04B 2237/582* (2013.01)
USPC .................................................. 252/301.4 R

(56) References Cited

U.S. PATENT DOCUMENTS

| | | | |
|---|---|---|---|
| 6,085,971 A | 7/2000 | Tews et al. | |
| 6,538,371 B1* | 3/2003 | Duggal et al. | 313/486 |
| 6,670,748 B2 | 12/2003 | Ellens et al. | |
| 6,844,285 B1 | 1/2005 | Wei | |
| 7,250,715 B2 | 7/2007 | Mueller et al. | |
| 7,329,988 B2 | 2/2008 | Shimizu et al. | |
| 7,361,938 B2 | 4/2008 | Mueller et al. | |
| 7,390,684 B2 | 6/2008 | Izuno et al. | |
| 7,514,721 B2* | 4/2009 | Krames et al. | 257/98 |
| 7,554,258 B2 | 6/2009 | Rossner et al. | |
| 7,679,281 B2 | 3/2010 | Kim et al. | |
| 8,207,663 B2* | 6/2012 | Sambandan et al. | 313/503 |
| 8,324,798 B2 | 12/2012 | Zhang et al. | |
| 8,339,025 B2 | 12/2012 | Nakamura et al. | |
| 8,828,531 B2* | 9/2014 | Pan et al. | 428/304.4 |
| 2004/0145308 A1 | 7/2004 | Rossner et al. | |
| 2004/0164277 A1 | 8/2004 | Yen et al. | |
| 2004/0256974 A1 | 12/2004 | Mueller-Mach et al. | |
| 2005/0137078 A1 | 6/2005 | Anderson et al. | |
| 2005/0230689 A1 | 10/2005 | Setlur et al. | |
| 2005/0269582 A1* | 12/2005 | Mueller et al. | 257/94 |
| 2006/0006366 A1* | 1/2006 | Abramov et al. | 252/301.4 R |
| 2006/0267500 A1 | 11/2006 | Chau et al. | |
| 2007/0126017 A1 | 6/2007 | Krames et al. | |
| 2007/0176539 A1 | 8/2007 | Mathai et al. | |
| 2007/0215890 A1 | 9/2007 | Harbers et al. | |
| 2007/0257597 A1 | 11/2007 | Sakata et al. | |
| 2008/0187746 A1* | 8/2008 | De Graaf et al. | 428/332 |
| 2008/0315235 A1 | 12/2008 | Murazaki | |
| 2009/0002810 A1 | 1/2009 | Jeon et al. | |
| 2009/0108507 A1 | 4/2009 | Messing et al. | |
| 2009/0189168 A1 | 7/2009 | Tsai | |
| 2009/0212697 A1 | 8/2009 | Nakamura et al. | |
| 2009/0244923 A1 | 10/2009 | Hofmann et al. | |
| 2010/0012964 A1 | 1/2010 | Copic et al. | |
| 2010/0067214 A1 | 3/2010 | Hoelen et al. | |
| 2010/0200874 A1 | 8/2010 | Shioi et al. | |
| 2010/0207512 A1 | 8/2010 | Miyagawa | |
| 2010/0276717 A1 | 11/2010 | Boerkekamp et al. | |
| 2011/0210658 A1* | 9/2011 | Pan et al. | 313/112 |
| 2011/0227477 A1 | 9/2011 | Zhang et al. | |
| 2012/0025247 A1* | 2/2012 | Ooyabu et al. | 257/98 |
| 2012/0068213 A1 | 3/2012 | Zhang et al. | |
| 2012/0141771 A1 | 6/2012 | Pan et al. | |
| 2013/0026922 A1* | 1/2013 | Allen et al. | 315/113 |

FOREIGN PATENT DOCUMENTS

| | | |
|---|---|---|
| EP | 0936682 A1 | 8/1999 |
| EP | 0 972 815 | 1/2000 |
| EP | 1139440 A2 | 10/2001 |
| EP | 1278250 A2 | 1/2003 |
| EP | 1473784 A2 | 11/2004 |
| JP | 08-151573 | 6/1996 |
| JP | 2009/177106 A | 8/2009 |
| WO | WO 2007/062136 A1 | 5/2007 |
| WO | WO 2007/107917 A2 | 9/2007 |
| WO | WO 2008/056292 A1 | 5/2008 |
| WO | WO 2008/112710 | 9/2008 |
| WO | WO 2009/038674 A2 | 3/2009 |
| WO | WO 2009038674 A2 * | 3/2009 |
| WO | WO 2010/010484 | 1/2010 |
| WO | WO 2011/097137 A1 | 8/2011 |
| WO | WO 2011/115820 | 9/2011 |
| WO | WO 2012/006289 | 1/2012 |
| WO | WO 2012/040046 A1 | 3/2012 |
| WO | WO 2012/116114 | 8/2012 |

OTHER PUBLICATIONS

Ohkubo et al., "Absolute Fluorescent Quantum Efficiency of NBS Phosphor Standard Samples," 87-93, J. Illum Eng Inst. Jpn. vol. 83, No. 2, 1999.

Nag et al., "Photoluminescence due to efficient energy transfer from $Ce^{3+}$ to $Tb^{3+}$ and $Mn^{2+}$ in $Sr_3Al_{10}SiO_{20}$," Materials Chemistry and Physics, Elsevier SA, 2005, vol. 91, No. 2-3, pp. 524-531.

Suriyamurthy, et al., "Luminescence of $BaAl_2O_4:Mn^{2+},Ce^{3+}$ phosphor," Journal of Luminescence, 2007, vol. 127, No. 2, pp. 483-488.

Wang et al., "$Mn^{2+}$ Activated Green, Yellow, and Red Long Persistent Phosphors," Journal of Luminescence, 2003, vol. 102-103, pp. 34-37.

Yang et al., "Influence of Doping and Coating on the Photoluminescence Properties of Yttrium Aluminum Garnet Phosphors," Journal of Electrochemical Society, 2007, vol. 154, No. 12, pp. J397-J401.

* cited by examiner

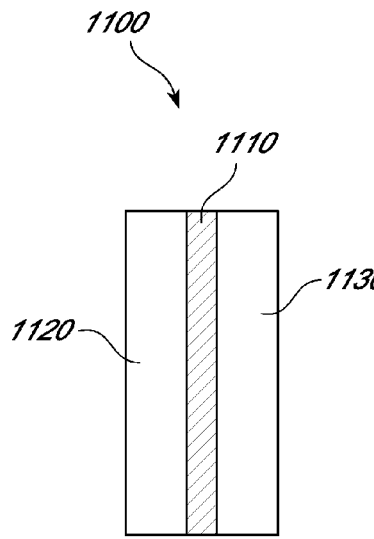
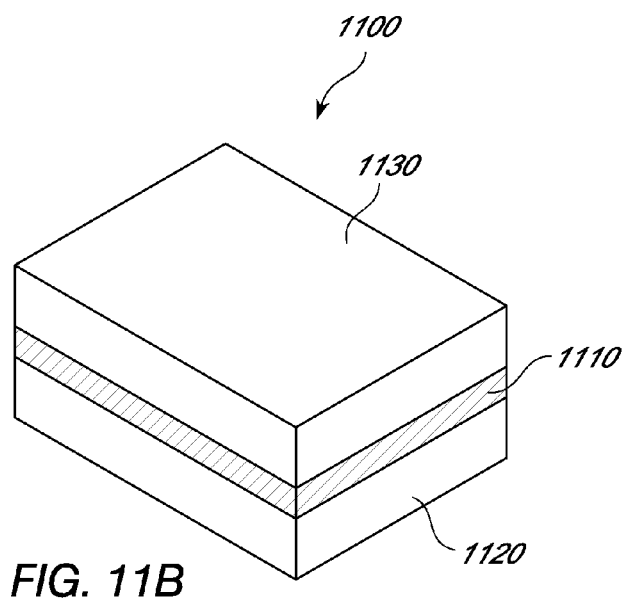
FIG. 11A  FIG. 11B
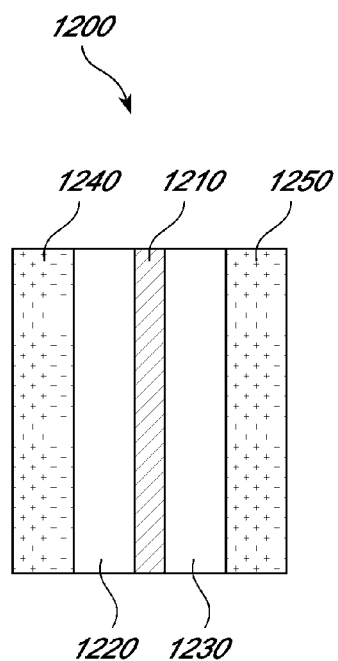
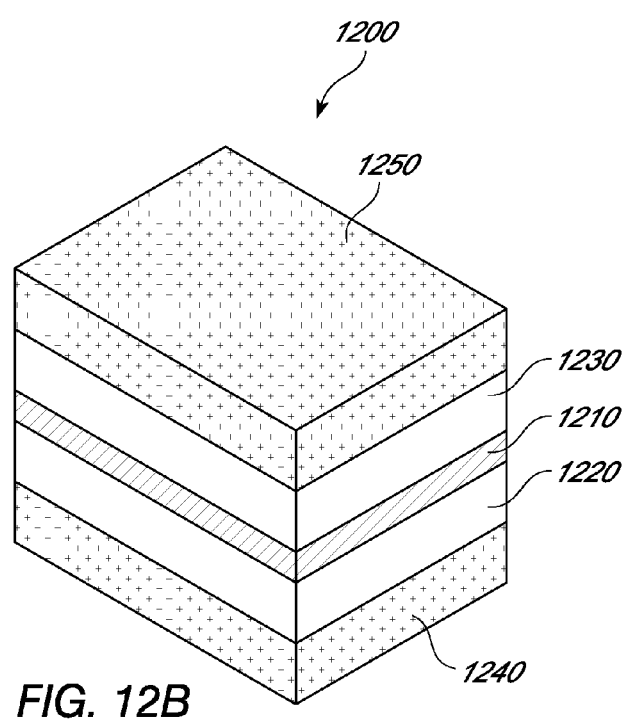
FIG. 12A  FIG. 12B

LIGHT EMITTING COMPOSITE WITH PHOSPHOR COMPONENTS

CROSS-REFERENCE TO RELATED APPLICATIONS

This application claims the benefit of priority to U.S. Application No. 61/446,346, filed Feb. 24, 2011, which is hereby incorporated by reference in its entirety.

BACKGROUND

1. Field

The present application relates to emissive ceramic materials having phosphor components.

2. Description

Solid state light emitting devices such as light emitting diode (LED), organic light emitting diode (OLED) or sometimes called organic electroluminescent device (OEL), and inorganic electroluminescent device (IEL) have been widely utilized for various applications such as flat panel display, indicator for various instrument, signboard, and ornamental illumination, etc. As the emission efficiency of these light emitting devices continues to improve, applications that require much higher luminance intensity, such as automobile headlights and general lighting, may soon become feasible. For these applications, white-LED is one of the promising candidates and have attracted much attention.

Currently, most light emitting diodes include yttrium aluminum garnet (YAG)-based powders encapsulated in a resin. Increasing the dopant concentration in these powders can obtain white light with improved color temperature. For example, increasing Ce dopant in YAG can increase re-absorption of yellow light, which provides red-shifting that improves the color temperature. Although this strategy can be successful with powders, many light emitting diodes include a transparent ceramic plate or laminated film that will not produce red-shifting when increasing the dopant concentration. The ceramic plates or laminated films fail to re-absorb yellow light because they exhibit high transparency and low scattering.

U.S. Pat. No. 7,390,684 which is hereby incorporated by reference in its entirety, uses a phosphor powder, where Gd can be substituted for Y at less than 20 atomic %. Although this substitution can result in colors with a greater green component, the composition exhibits a significant decrease in luminescence with increased Gd content.

SUMMARY

Disclosed herein are emissive ceramic materials having high Gadolinium (Gd) concentrations.

Some embodiments disclosed herein include a thermally stable ceramic body comprising an emissive layer, wherein said emissive layer comprises a compound represented by the formula $(A_{1-x-z}Gd_xD_z)_3B_5O_{12}$, wherein: D is a first dopant selected from the group consisting of Nd, Er, Eu, Mn, Cr, Yb, Sm, Tb, Ce, Pr, Dy, Ho, Lu and combinations thereof; A is selected from the group consisting of Y, Lu, Ca, La, Tb, and combinations thereof; B is selected from the group consisting of Al, Mg, Si, Ga, In, and combinations thereof; x is in the range of about 0.20 to about 0.80; and z is in the range of about 0.001 to about 0.10.

In some embodiments, D includes Ce.

In some embodiments, D is Ce.

In some embodiments, wherein A is Y.

In some embodiments, B is Al.

In some embodiments, the ceramic body exhibits a thermal conductivity of at least 8 W/mK.

In some embodiments, the first dopant in the emissive layer has a first dopant concentration gradient along a thickness of the emissive layer.

In some embodiments, wherein the first dopant concentration gradient includes a maximum first dopant concentration at or near the center along the thickness of the emissive layer.

In some embodiments, the first dopant concentration gradient includes a maximum first dopant concentration at or near a surface along the thickness of the emissive layer.

In some embodiments, the emissive layer includes a Gd concentration gradient along the thickness of the emissive layer.

In some embodiments, the first dopant concentration gradient is broader relative to the Gd concentration gradient.

In some embodiments, the Gd concentration gradient includes a maximum Gd concentration at or near the maximum first dopant concentration along the thickness of the emissive layer.

In some embodiments, the ceramic body exhibits an internal quantum efficiency (IQE) of at least about 0.70 when exposed to radiation having a wavelength of about 455 nm.

In some embodiments, the ceramic body exhibits a wavelength of peak emission of at least about 535 nm.

Some embodiments disclosed herein include sintering an assembly to obtain the ceramic body disclosed herein.

Some embodiments disclosed herein include a method of forming a thermally stable ceramic body comprising sintering an assembly, wherein the assembly comprises a co-doped layer having a thickness in the range of about 10 μm to about 200 μm, wherein the co-doped layer comprises: yttrium aluminum garnet (YAG), a YAG precursor, or combination thereof; a first dopant selected from the group consisting of Nd, Er, Eu, Mn, Cr, Yb, Sm, Tb, Ce, Pr, Dy, Ho, Lu and combinations thereof; and about 20 at % to about 80 at % Gd relative to the amount of yttrium component in YAG, YAG precursor, or the combination thereof.

In some embodiments, the assembly further includes a first layer disposed on one side of the doped layer, wherein the first layer comprises YAG, a YAG precursor, or combination thereof, wherein the first layer is substantially free of the first dopant, and wherein the first layer has a thickness in the range of about 40 μm to about 800 μm.

In some embodiments, the first layer further comprises Gd.

In some embodiments, the first layer includes about 20 at % to about 80 at % Gd.

In some embodiments, the co-doped layer is disposed between the first layer and a second layer, the second layer comprising YAG, a YAG precursor, or combination thereof, wherein the second layer is substantially free of the first dopant, and wherein the first and second layers each independently have a thickness in the range of about 40 μm to about 400 μm.

In some embodiments, the second layer further includes Gd.

In some embodiments, the second layer comprises about 20 at % to about 80 at % Gd.

In some embodiments, the co-doped layer includes about 20 at % to about 80 at % Gd.

In some embodiments, the co-doped layer comprises about 0.1 at % to about 10 at % first dopant with respect to the yttrium component.

In some embodiments, the first dopant is Ce.

In some embodiments, sintering said assembly comprises heating the assembly at a temperature in the range of about 1000° C. to about 1900° C. for at least about 2 hrs.

In some embodiments, said temperature is in the range of about 1300° C. to about 1800° C.

In some embodiments, the assembly is heated at said temperature for at least about 5 hours.

In some embodiments, the assembly is heated at said temperature for no more than about 60 hours.

In some embodiments, at least about 30% of the first dopant in the co-doped layer diffuses out of the co-doped layer during said process.

In some embodiments, wherein no more than about 70% of the Gd in the co-doped layer diffuses out of the co-doped layer during said process.

In some embodiments, the ceramic body exhibits an internal quantum efficiency (IQE) of at least about 0.70 when exposed to radiation having a wavelength of about 455 nm.

In some embodiments, the ceramic body exhibits a wavelength of peak emission of at least about 535 nm.

Some embodiments disclosed herein include the ceramic body made by any of the methods disclosed herein.

Some embodiments disclosed herein include a lighting apparatus including: a light source configured to emit blue radiation; and any of the ceramic bodies disclosed herein, wherein the ceramic body is configured to receive at least a portion of the blue radiation. In some embodiments, the blue radiation has a wavelength of peak emission between about 360 nm and about 500 nm.

Some embodiments disclosed herein include a method of producing light comprising exposing any of the ceramic bodies disclosed herein to a blue radiation. In some embodiments, the blue radiation has a wavelength of peak emission between about 360 nm and about 500 nm.

BRIEF DESCRIPTION OF THE DRAWINGS

FIGS. 11A-B show one example of an assembly that may be sintered to form a ceramic body.

FIGS. 12A-B show one example of an assembly that may be sintered to form a ceramic body.

DETAILED DESCRIPTION

Figure 1A:
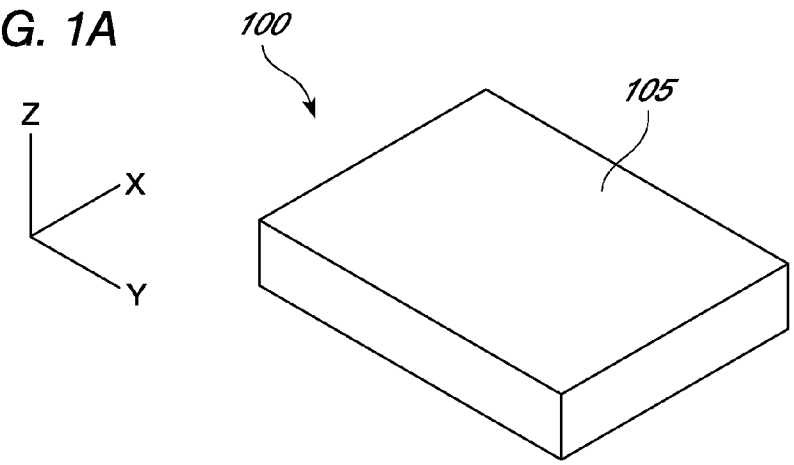
FIGS. 1A-C illustrate non-limiting examples of ceramic bodies within the scope of the present application.

Disclosed herein are emissive ceramic materials having high Gadolinium (Gd) concentrations. Applicants have surprisingly found that these emissive ceramic materials can exhibit improved chromaticity while still maintaining a high quantum efficiency relative to standard emissive materials (e.g., relative to Ce-doped ceramic materials without Gd). The emissive ceramic materials, in some embodiments, can include a dopant concentration gradient along a thickness of the emissive layer. Also disclosed herein are methods of making the emissive ceramic material, a lighting apparatus including the emissive ceramic material, and methods of producing light using the emissive ceramic material.

Emissive Ceramics

The phosphor compositions, in some embodiments, may be represented by Formula I: $(A_{1-x-z}Gd_xD_z)_3B_5O_{12}$, where D is a first dopant selected from Nd, Er, Eu, Mn, Cr, Yb, Sm, Tb, Ce, Pr, Dy, Ho, Lu and combinations thereof; A is selected from Y, Lu, Ca, La, Tb, and combinations thereof; B is selected from Al, Mg, Si, Ga, In, and combinations thereof; x is in the range of about 0.20 to about 0.80; and z is in the range of about 0.001 to about 0.10.

In some embodiments, A is selected from Y, Lu, Ca, La, Tb, and combinations thereof. In some embodiments, A is Y. In some embodiments, A is selected from Lu, Ca, La and Tb. A may also be a combination of at least two elements (e.g., two, three, four, or five elements) selected from Y, Lu, Ca, La, and Tb. As an example, A may be a combination of a first element and a second element, each selected from Y, Lu, Ca, La, and Tb. The molar ratio of the first element to the second element can be, for example, at least about 10 to 90; at least about 20 to 80; at least about 40 to 60; at least about 1 to 1; at least about 60 to 40; at least about 80 to 20; at least about 90 to 10; or at least about 95 to 5. The molar ratio of the first element to the second element can also be, for example, no more than about 99 to 1; no more than about 90 to 10; no more than about 80 to 20; no more than about 60 to 40; or no more than about 1 to 1. In some embodiments, A is a combination where the first element is Y. In some embodiments, A is a combination where the second element is Lu. In some embodiments, A is a combination where the second element is Ca. For example, A may be a combination of Y and Lu with a molar ratio of about 1 to 1.

In some embodiments, B is selected from Al, Mg, Si, Ga, In, and combinations thereof. In some embodiments, B is Al. In some embodiments, B is selected from Mg, Si, Ga, and In. B may also be a combination of at least two elements (e.g., two, three, four, or five elements) selected from Al, Mg, Si, Ga, and In. As an example, B may be a combination of a first element and a second element, each selected from Al, Mg, Si, Ga, and In. The molar ratio of the first element to the second element can be, for example, at least about 10 to 90; at least about 20 to 80; at least about 40 to 60; at least about 1 to 1; at least about 60 to 40; at least about 80 to 20; at least about 90 to 10; or at least about 95 to 5. The molar ratio of the first element to the second element can also be, for example, no more than about 99 to 1; no more than about 90 to 10; no more than about 80 to 20; no more than about 60 to 40; or no more than about 1 to 1. In some embodiments, B is a combination where the first element is Al. In some embodiments, B is a combination where the second element is Mg. In some embodiments, B is a combination where the second element is Si. For example, B may be a combination of Al and Mg with a molar ratio of about 1 to 1.

In some embodiments, D is a first dopant selected from Nd, Er, Eu, Mn, Cr, Yb, Sm, Tb, Ce, Pr, Dy, Ho, Lu and combinations thereof. In some embodiments, the first dopant is Ce. In some embodiments, the first dopant is selected from Nd, Er, Eu, Mn, Cr, Yb, Sm, Tb, Pr, Dy, Ho, and Lu. The first dopant may also be a combination of at least two elements (e.g., two, three, four, five, six, seven, or more elements) selected from Nd, Er, Eu, Mn, Cr, Yb, Sm, Tb, Ce, Pr, Dy, Ho, and Lu. As an example, the first dopant may be a combination of a first element and a second element, each selected from Nd, Er, Eu, Mn, Cr, Yb, Sm, Tb, Ce, Pr, Dy, Ho, and Lu. The molar ratio of the first element to the second element can be, for example, at least about 10 to 90; at least about 20 to 80; at least about 40 to 60; at least about 1 to 1; at least about 60 to 40; at least about 80 to 20; at least about 90 to 10; or at least about 95 to 5. The molar ratio of the first element to the second element can also be, for example, no more than about 99 to 1; no more than about 90 to 10; no more than about 80 to 20; no more than about 60 to 40; or no more than about 1 to 1. In some embodiments, the first dopant is a combination where the first element is Ce. In some embodiments, the first dopant is a combination where the second element is Eu. In some embodiments, the first dopant is a combination where the second element is Mn. For example, the first dopant may be a combination of Ce and Eu with a molar ratio of about 1 to 1.

The variable x can be, in some embodiments, in the range of about 0.20 to about 0.80. The variable x can be, for example, at least about 0.20; at least about 0.25; at least about 0.30; or at least about 0.35. The variable x can be, for example, no more than about 0.80; no more than about 0.70; no more than about 0.60; no more than about 0.50; no more than about 0.45; or no more than about 0.40. Non-limiting examples of values for x include about 0.30 and about 0.35.

The variable z can be, in some embodiments, in the range of about 0.001 to about 0.10. The variable z can be, for example, at least about 0.001; at least about 0.005; at least about 0.01; or at least about 0.012. The variable z can be, for example, no more than about 0.10; no more than about 0.7; no more than about 0.5; no more than about 0.4; no more than about 0.3; or no more than about 0.2. Non-limiting examples of values for z include about 0.015 and about 0.01.

The compositions of the present application, in some embodiments, are thermally stable when emitting light. As used herein, "thermally stable" refers to a material that retains at least 60% of its emission intensity relative to a comparable ceramic material without gadolinium. For example, $(Y_{0.635}Gd_{0.35}Ce_{0.015})_3Al_5O_{12}$ may be thermally stable if it retains at least 90% of the emission intensity of $(Y_{0.985}Ce_{0.015})_3Al_5O_{12}$. The thermally stable ceramic may, for example, retain at least 70%; at least 80%; at least 85%; at least 90%; at least 95%; or at least 97% of the emission intensity of a comparable ceramic material without gadolinium.

Applicants have surprisingly found that the composition of formula I, which includes high gadolinium concentrations (e.g., x can be in the range about 0.20 to about 0.80), can exhibit superior chromaticity relative to a comparable ceramic material without Gadolinium. These compositions can also be thermally stable as discussed above. Without being bound to any particular theory, it is believed that Gd-doped materials are more susceptible to thermal quenching at operating temperatures found in standard lighting apparatuses. For example, LEDs often include an emissive phosphor powder encapsulated within a resin that operate at high temperatures (e.g., about 300° C.) due to the poor thermal conductivity of the resin. Applicants have surprisingly found that including a dopant concentration gradient or a Gadolinium concentration gradient can enable the use of these higher Gadolinium levels. Applicants have also surprisingly found that a dopant concentration gradient or a Gadolinium concentration gradient can enable the use of these higher Gadolinium levels without sacrificing IQE (efficiency) and more desirable thermal properties, e.g., greater thermal stability. The dopant concentration gradient and Gadolinium concentration can be prepared, for example, by sintering an assembly having a plurality of different layers. Applicants have surprisingly discovered that certain assembly configurations can obtain ceramic bodies with superior IQE and thermal properties. Accordingly, the compositions of the present application may be thermally stable when configured to maintain low operating temperatures while emitting light.

In some embodiments, a ceramic body includes the composition of formula I and exhibits a thermal conductivity that is sufficient for the ceramic body to maintain a temperature below about 200° C. when emitting light. For example, the ceramic body may be exposed to blue radiation for a time period sufficient to obtain a steady state temperature (e.g., about 1 hr. or more) below 200° C. The blue radiation can have a wavelength of peak emission of about 455 nm and be emitted from an AlInGaN-based single-crystal semiconductor coupled to an electric source. The steady state temperature may be below about 200° C. The ceramic body can, for example, have a thermal conductivity sufficient to maintain a temperature of no more than about 200° C.; no more than about 150° C.; no more than about 125° C.; no more than about 100° C.; or no more than about 75° C. In some embodiments, the temperature can be determined when exposing the ceramic body to radiation from an AlInGaN-based single-crystal semiconductor using a forward current of at least about 350 mA. The temperature can also be determined when exposing the ceramic body to radiation from an AlInGaN-based single-crystal semiconductor using, for example, a forward current of at least about 350 mA; at least about 400 mA; at least about 500 mA; at least about 600 mA; at least about 800 mA; or at least about 1000 mA.

In some embodiment, the compositions are configured within a ceramic body that exhibits a thermal conductivity of at least about 8 W/mK. The thermal conductivity of the ceramic body may, for example, be at least about 8 W/mK; at least about 10 W/mK; at least about 12 W/mK; or at least about 14 W/mK.

The ceramic body may, in some embodiments, be a solid agglomerate of phosphor components. As discussed further below, the solid agglomerate can be prepared, for example, by sintering a mold or laminated sheets to form a ceramic plate. The solid agglomerate can exhibit a high thermal conductivity to maintain a low operating temperature that is sufficient to reduce thermal quenching.

In some embodiments, the ceramic body includes at least about 10% by volume of the composition of formula I. The amount of the composition of formula I in the ceramic body may, for example, be at least about 10% volume; at least about 20% by volume; at least about 30% by volume; at least about 50% by volume; or at least about 80% by volume.

In some embodiments, the ceramic body includes low amounts (if any) of binding medium. The low amount of binding medium may be sufficient to obtain a high thermal conductivity of the ceramic body (e.g., at least about 8 W/mK). For example, a typical LED-based lighting apparatus includes a phosphor powder encapsulated within an epoxy binding medium. The low thermal conductivity of the epoxy can result in higher operating temperatures that increase thermal quenching. As used herein, a "binding medium" includes non-phosphor components that are configured to provide adhesion between phosphor components in the ceramic body. Resins are typically used as the binding medium, such as an epoxy, acrylic, and the like; however, the binding medium may optionally include non-resin components. In some embodiments, the binding medium is an organic material. In some embodiments, the binding medium is a resin. The amount of binding medium in the ceramic body can be, for example, no more than about 20% by volume; no more than about 15% by volume; no more than about 10% by volume; no more than about 5% by volume; no more than about 3% by volume; or no more than about 1% by volume. In some embodiments, the ceramic body is substantially free of binding medium. In some embodiments, the ceramic body includes no more than trace amounts of binding medium.

The ceramic body can include an emissive layer having the composition of formula I. In some embodiments, the emissive layer can have a thickness in the range of about 10 µm to about 1 mm. The emissive layer may have a thickness, for example, of at least about 10 µm; at least about 50 µm; at least about 100 µm; at least about 200 µm; or at least about 250 µm. The emissive layer may have a thickness, for example, of no more than about 1 mm; no more than about 800 µm; no more than about 600 µm; no more than about 400 µm; or no more than about 300 µm.

The ceramic body may, in some embodiments, have a density greater than a phosphor that is dispersed in a resin. Typical resins have a density of about 1.1 g/cm$^3$, which decreases the density when mixed with a phosphor material. The ceramic body may, for example, have a density of at least about 3 g/cm$^3$; at least about 3.5 g/cm$^3$; at least about 4 g/cm$^3$; or at least about 4.3 g/cm$^3$. For example, the ceramic body may have a density of about 4.5 g/cm$^3$.

The ceramic bodies of the present application may optionally include dopant concentration gradients. The ceramic body may, for example, be prepared by sintering an assembly. Therefore, a "ceramic body" generally includes the final emissive material that can be used for lighting purposes, while an "assembly" is a composite that may be sintered to form the ceramic body. As will be discussed further below, sintering an assembly is one method for causing dopant diffusion that forms a dopant concentration gradient within the final ceramic body.

Figure 1B:
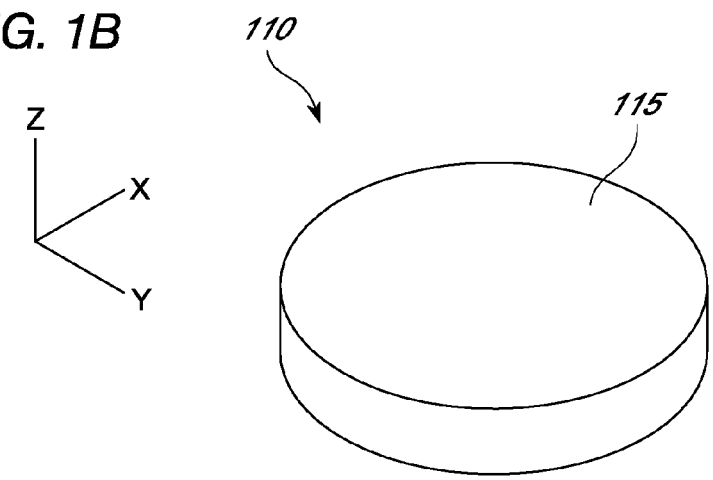
Figure 1C:
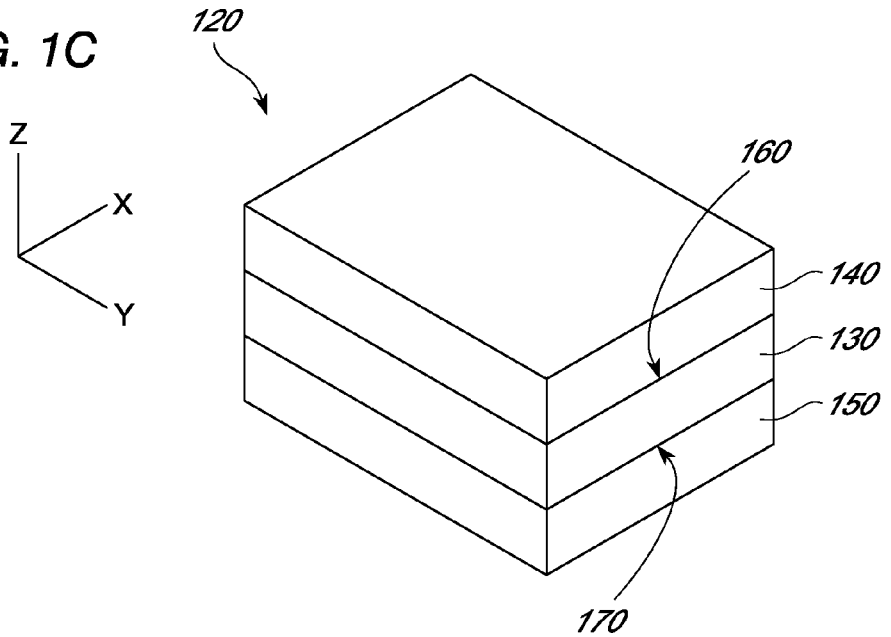

The ceramic body may include a dopant concentration gradient along "a thickness of the emissive layer." FIGS. 1A-C show the thickness of the emissive layer along the z-axis for various non-limiting examples of the ceramic body. FIG. 1A illustrates one non-limiting example of a ceramic body. Ceramic body 100 may contain only emissive layer 105 which includes a dopant and a generally uniform distribution of a host material. For example, the emissive layer may be a composition of formula I having Gd and Ce dopants within a yttrium aluminum garnet (YAG) host material. Ceramic body 100 includes a length, width, and thickness along the x-axis, y-axis, and z-axis, respectively. In some embodiments, the thickness of the emissive layer is the smallest dimension of the ceramic body. For example, the ceramic body may have both the length and width equal to about 1 mm, and a thickness of about 100 µm. In some embodiments, the thickness is not the smallest dimension. Of course, numerous other geometries are within the scope of the present application, which is not limited to the generally cuboid geometry portrayed in FIG. 1A. For example, the ceramic body may also be cylindrical, cubic, etc. Furthermore, there is no requirement that the ceramic body is symmetric, include clearly defined edges or a specific number of faces.

FIG. 1B illustrates another embodiment of a ceramic body. Ceramic body 110 may contain only emissive layer 115 which has a generally uniform dispersion of a host material and has a cylindrical or disk-like geometry. Emissive layer 115 includes a thickness along the z-axis.

FIG. 1C illustrates some embodiments of a ceramic body that includes an emissive layer and additional layers. Ceramic body 120 includes emissive layer 130 interposed between two non-emissive layers 140 and 150 (e.g., two layers each consisting of yttrium aluminum garnet, yttrium aluminum garnet precursor, e.g., aluminum oxide, or a combination thereof). Interface 160 is between emissive layer 130 and non-emissive layer 140. Similarly, interface 170 is between emissive layer 130 and non-emissive layer 150. In this embodiment, the thickness of the emissive layer does not include portions of non-emissive layers 130 and 140. The thickness of emissive layer 130 is between interface 160 and interface 170 along the z-axis. The thickness of emissive layer 130 along the z-axis is therefore less than the thickness of ceramic body 120.

Figure 2:
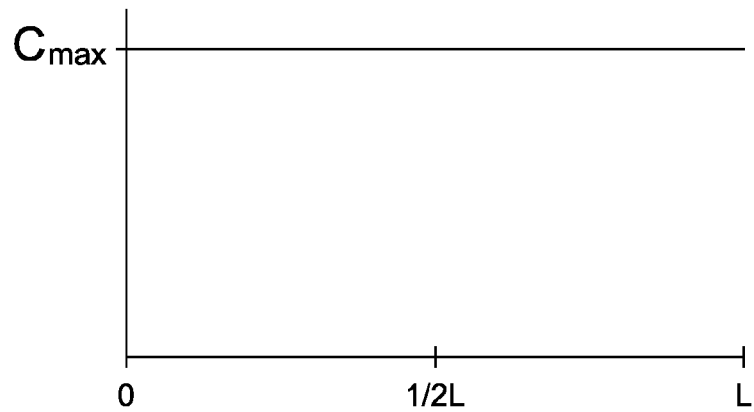
FIG. 2 is a graph showing a prior art example of a dopant concentration profile along the thickness of an emissive layer.

FIG. 2 is a graph showing a prior art example of a dopant concentration profile along the thickness of an emissive layer. The horizontal axis is the position along the thickness of the emissive layer (e.g., along the z-axis of emissive layer 105 illustrated in FIG. 1A). The position '0' along the horizontal axis would be at a first surface of the emissive layer (e.g., the bottom face of ceramic body 100). The position '½L' along the horizontal axis would be at the midpoint along the thickness (e.g., at about the center along the thickness of ceramic body 100). The position 'L' on the horizontal axis would be at a second surface of the emissive layer that is opposite to the first surface along the thickness (e.g., the top face of ceramic body 100). Accordingly, the first surface and the second surface are on opposite sides of the thickness (e.g., the bottom face and top face of ceramic body 100 are on opposite sides along the z-axis).

Meanwhile, the vertical axis in FIG. 2 is the dopant concentration at a given position along the thickness. This prior art dopant concentration profile has several notable features. First, the example generally includes a substantially constant dopant concentration profile along the thickness (i.e., the slope is about 0 along the entire thickness). Thus, this example does not include a dopant concentration gradient. Second, the dopant concentration profile has a maximum dopant concentration ($C_{max}$) found along substantially all of the thickness. Third, the minimum dopant concentration ($C_{min}$) is about the same as the maximum dopant concentration. Fourth, the dopant concentration is greater than half the maximum dopant concentration along substantially all of the thickness. In other words, the substantially constant dopant concentration profile does not include a half-maximum dopant concentration ($C_{max/2}$).

Figure 3:
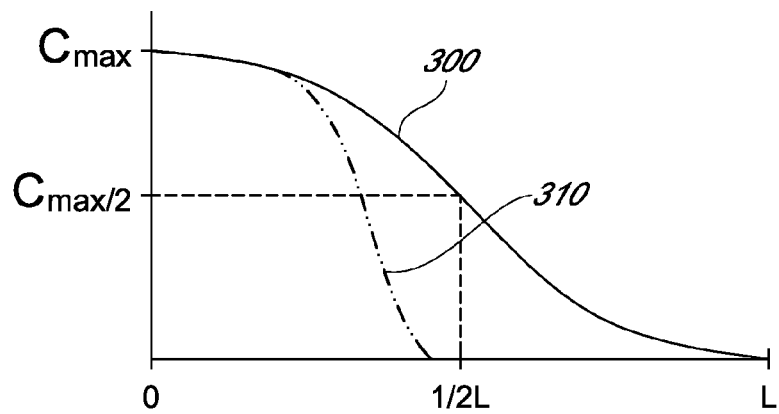
FIG. 3 is a graph showing one embodiment of a ceramic body having dopant concentration gradients that is within the scope of the present application.

FIG. 3 is a graph showing one embodiment of a dopant concentration gradient for a ceramic body that is within the scope of the present application. The ceramic body can include a composition of formula I, which may include at least two dopants: (i) Gd and (ii) a first dopant select from Nd, Er, Eu, Mn, Cr, Yb, Sm, Tb, Ce, Pr, Dy, Ho, Lu, or combinations therefore. First dopant concentration gradient 300 (e.g., a Ce dopant concentration gradient) has a maximum first dopant concentration located at or near a first surface of the emissive layer, while a minimum dopant concentration is located at or near a second surface that is opposite to the first surface along the thickness of the emissive layer. Also, a half-maximum first dopant concentration is located at or near the center of the emissive layer.

Gd dopant concentration gradient 310 also includes a maximum Gd concentration located at or near a first surface of the emissive layer. FIG. 3 depicts the dopant concentration gradients without units of measurement; therefore, the maximum first dopant concentration is not necessarily the same as the maximum Gd concentration. In some embodiments, the maximum Gd concentration is greater than the maximum first dopant concentration. As shown by Gd concentration gradient 310, about half of the thickness of the emissive layer is substantially free of Gd. Also, a half-maximum Gd concentration is located between the maximum Gd concentration and the center along the thickness of the emissive layer (e.g., at about ⅓L). The half-maximum first dopant concentration can be located a first distance apart from the maximum first dopant concentration. And the half-maximum Gd concentration can be located a second distance apart from the maximum Gd concentration. In some embodiments, the first distance is less than the second distance.

In contrast to the substantially constant dopant concentration profile depicted in FIG. 2, the dopant concentration gradients depicted in FIG. 3 have a varying slope that includes non-zero values. As used herein, the term "slope" means the rate of change of the concentration relative to the change in position along the thickness (e.g., horizontal axis in FIG. 2). If the dopant concentration can be reasonably represented by a continuous function f(x), then the slope may be determined from the derivative of this function. As an example, the absolute value of the slope at about ½L for first dopant concentration gradient 300 (or at about the half-maximum first dopant concentration) in FIG. 3 is more than about the maximum dopant concentration divided by the thickness of the yttrium aluminum garnet region ($C_{max}/L$). In some embodiments, the slope at the half-maximum first dopant concentration is less than the slope at the half-maximum Gd concentration.

Figure 4:
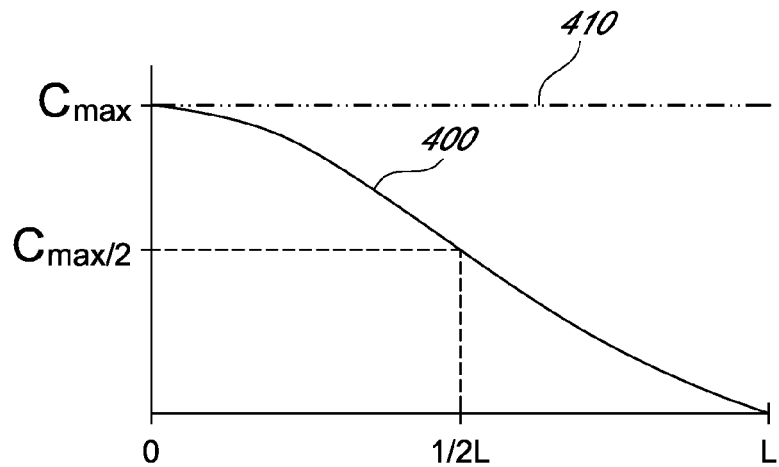
FIG. 4 is a graph showing one embodiment of a ceramic body having a first dopant concentration gradient that is within the scope of the present application.

FIG. 4 is a graph showing another embodiment of a dopant concentration gradient for a ceramic body that is also within the scope of the present application. In this embodiment, the ceramic body has first dopant concentration gradient 400, but includes a generally constant Gd dopant concentration profile 410. Thus, the Gd concentration profile can have generally the same characteristics as the dopant concentration profile depicted in FIG. 2.

Figure 5:
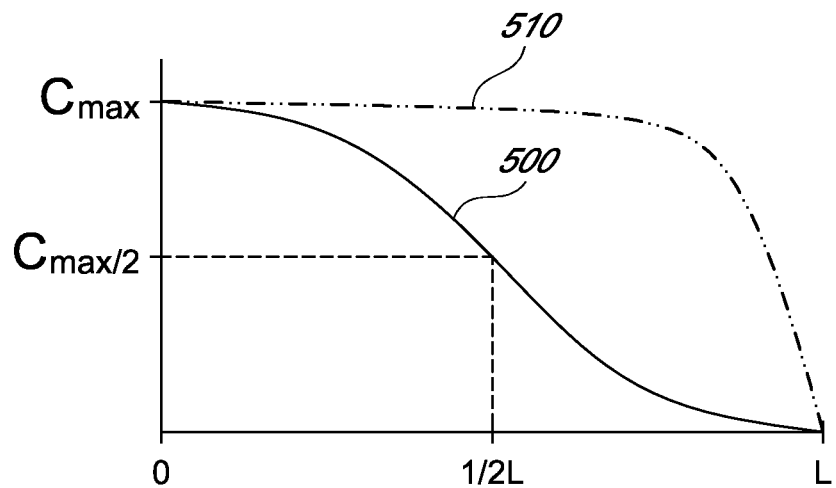
FIG. 5 is a graph showing one embodiment of a ceramic body having dopant concentration gradients that is within the scope of the present application.

FIG. 5 is a graph showing another embodiment of a dopant concentration gradient for a ceramic body that is also within the scope of the present application. In this embodiment, first dopant concentration gradient 500 is narrower than Gd concentration gradient 510. The half-maximum first dopant concentration can be located a first distance apart from the maximum first dopant concentration. And the half-maximum Gd concentration can be located a second distance apart from the maximum Gd concentration. In some embodiments, the first distance is greater than the second distance.

Figure 6:
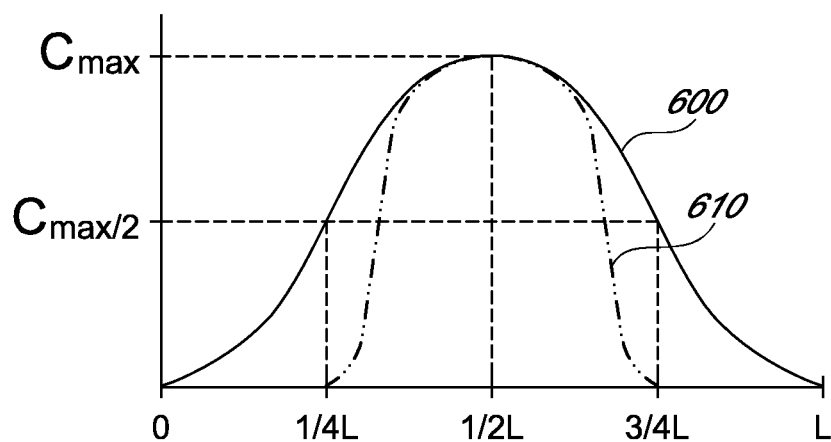
FIG. 6 is a graph showing one embodiment of a ceramic body having dopant concentration gradients that is within the scope of the present application.

FIG. 6 shows some embodiments of a dopant concentration gradient for a ceramic body that is also within the scope of the present application. First dopant concentration gradient 600 has a maximum first dopant concentration at or near the center of the emissive layer, while minimum first dopant concentrations are located at or near the first and the second surfaces that are on opposite sides along the thickness. Also, two half-maximum first dopant concentrations are located at about one-quarter of L (i.e., ¼L) and three-quarters of L. In this embodiment, both half-maximum first dopant concentrations have slopes with about the same magnitude. The first dopant concentration gradient also exhibits non-zero values (or more than trace amounts) for the dopant concentration along substantially all of the thickness.

Gd concentration gradient 610 also has a maximum Gd concentration at or near the center of the emissive layer. In some embodiments, the maximum Gd concentration is located at or near the maximum first dopant concentration. Gd concentration gradient 610 includes portions near the first and second surfaces of the emissive layer that are substantially free of Gd. Also, two half-maximum Gd concentrations are located at about one-third of L (i.e., L/3) and two-thirds of L. In this embodiment, both half-maximum Gd concentrations have slopes with about the same magnitude. In some embodiments, the distance between the two half-maximum Gd concentrations is less than the distance between the two half-maximum first dopant concentrations.

Figure 7:
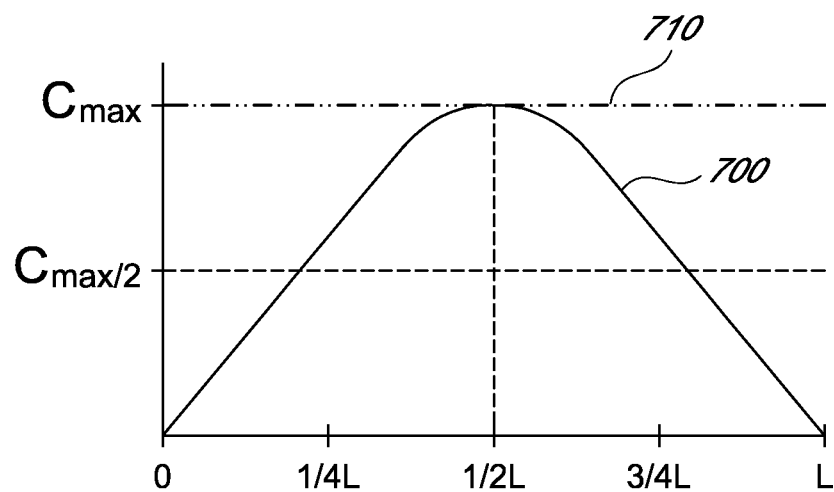
FIG. 7 is a graph showing one embodiment of a ceramic body having a first dopant concentration gradient that is within the scope of the present application.

FIG. 7 shows some embodiments of a dopant concentration gradient for a ceramic body that is also within the scope of the present application. First dopant concentration gradient 700 has generally the same characteristics as first dopant concentration gradient 600 depicted in FIG. 6. Gd concentration profile 710 has generally the same characteristics as Gd concentration profile 410.

Figure 8:
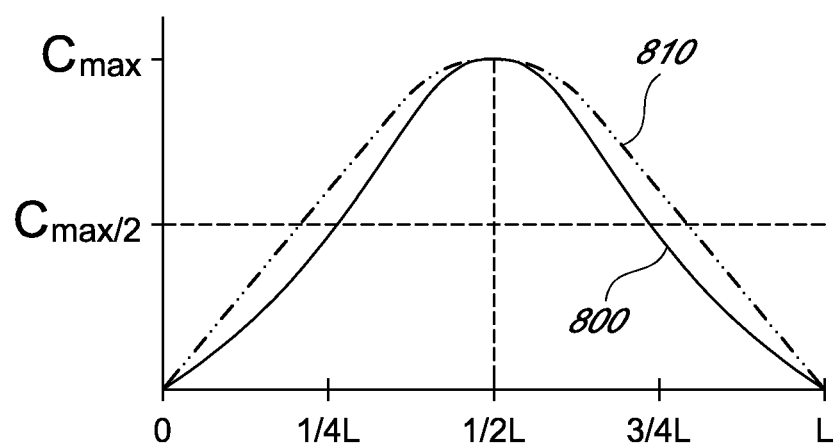
FIG. 8 is a graph showing one embodiment of a ceramic body having dopant concentration gradients that is within the scope of the present application.

FIG. 8 shows some embodiments of a dopant concentration gradient for a ceramic body that is also within the scope of the present application. First dopant concentration gradient 800 has generally the same characteristics as first dopant concentration gradient 600 depicted in FIG. 6. Meanwhile, Gd dopant concentration 810 is broader than first dopant concentration gradient 800. In some embodiments, the distance between the two half-maximum Gd concentrations is greater than the distance between the two half-maximum first dopant concentrations.

Some of the first dopant concentration gradients and Gd concentration gradients depicted in FIGS. 3-8 are generally symmetric about the center of the emissive layer. In other words, if each concentration gradient could be reasonably represented by a continuous function f(x), then f(½L−z) would be about the same as f(½L+z) for 0≤z≤½L. The concentration gradients may also be characterized by a single peak. For example, first dopant concentration gradient 600 has a full-width at half-maximum (i.e., the distance between the two half-maximum dopant concentrations along the thickness) of about ½L (i.e., ¾L minus ¼L). In some embodiments, the Gd concentration gradient includes a peak having a full-width at half-maximum that is greater than the full-width at half-maximum of a peak in the first dopant concentration gradient. In some embodiments, the Gd concentration gradient includes a peak having a full-width at half-maximum that is less than the full-width at half-maximum of a peak in the first dopant concentration gradient. In some embodiments, the Gd concentration gradient includes a peak having a full-width at half-maximum that is about the same as the full-width at half-maximum of a peak in the first dopant concentration gradient.

Another feature that may be used to characterize the concentration gradients is the average dopant concentration. The average dopant concentration may be determined by summing a series of evenly distributed concentrations along the entire thickness and dividing this sum by the total number of concentrations used in the summation. Alternatively, if the dopant concentration gradient can be reasonably represented by a continuous function f(x), the average dopant concentration may be equal to $$\int_0^L \frac{f(x)dx}{L}.$$

As one example, the average dopant concentration for Gd concentration profile 410 depicted in FIG. 4 would be the maximum dopant concentration. In contrast, first dopant concentration gradient 600 and Gd concentration gradient 610 depicted in FIG. 6 illustrate average concentrations that are less than their respective maximum concentrations.

As would be appreciated by those skilled in the art, FIGS. 2-8 represent simplified illustrations of dopant concentration gradients and profiles. Various factors should be considered when comparing these graphs with experimental results. For example, one may need to account for noise that distorts the measured dopant concentration. This may require manipulating the data to reduce distortions using various methods known in the art (e.g., using Fourier transforms, averaging measurements, etc.). Similarly, additional distortions may arise due to surface-effects or minor defects in the material. The skilled artisan can recognize these distortions and appreciate that these differences are not distinguishing features from the illustrated dopant concentration gradients and profiles disclosed herein.

Time-Of-Flight Secondary Ion Mass Spectroscopy can be used, for example, to determine the dopant concentration, thickness or distances/locations of the respective points of interest, and the resultant slopes at the respective points of interest. For examples of using these methods to determine characteristic of the concentration gradients, see U.S. Application Nos. 61/418,725 and Ser. No. 13/306,797, which are hereby incorporated by reference in their entirety.

As disclosed above, one advantage of the ceramic bodies disclosed herein exhibit is the unexpectedly high internal quantum efficiencies. In some embodiments, the ceramic body exhibits an internal quantum efficiency (IQE) of at least about 0.70 when exposed to radiation having a wavelength of about 455 nm. In some embodiments, the ceramic body exhibits an internal quantum efficiency (IQE) of at least about 0.80 when exposed to radiation having a wavelength of about 455 nm. In some embodiments, the ceramic body exhibits an internal quantum efficiency (IQE) of at least about 0.85 when exposed to radiation having a wavelength of about 455 nm. In some embodiments, the ceramic body exhibits an internal quantum efficiency (IQE) of at least about 0.90 when exposed to radiation having a wavelength of about 455 nm. In some embodiments, the ceramic body exhibits an internal quantum efficiency (IQE) of at least about 0.95 when exposed to radiation having a wavelength of about 455 nm.

The ceramic body may also have a high transmittance. For example, the ceramic body can have a transmittance of at least 70%. In some embodiments, the ceramic body can have a transmittance of at least 80%. In some embodiments, the ceramic body can have a transmittance of at least 90%. The transmittance may be determined, for example, at about 800 nm.

The compositions of the present application can, in some embodiments, exhibit a red-shifted wavelength of peak emission relative to a comparable composition without gadolinium. In some embodiments, the ceramic body exhibits a wavelength of peak emission of at least about 535 nm. In some embodiments, the ceramic body exhibits a wavelength of peak emission of at least about 540 nm. In some embodiments, the ceramic body exhibits a wavelength of peak emission of at least about 545 nm. In some embodiments, the ceramic body exhibits a wavelength of peak emission of at least about 550 nm. In some embodiments, the ceramic body exhibits a wavelength of peak emission of at least about 555 nm. The wavelength of peak emission can be determined, for example, by exposing the ceramic body to radiation having a wavelength of about 455 nm.

Methods of Making Emissive Ceramics

Some embodiments disclosed herein include methods of making an emissive ceramic that includes the compositions of formula I. The method can include, for example, sintering an assembly to form the ceramic body. The methods may be used to prepare any of the ceramic bodies disclosed above.

Various methods are known in the art for sintering an assembly to form the ceramic body. For example, two or more cast tapes may be laminated and sintered according to the disclosure in U.S. Pat. No. 7,514,721, U.S. Publication No. 2009/0108507, U.S. Application No. 61/418,725, and U.S. Application Ser. No. 13/306,797, each of which are hereby incorporated by reference in their entirety. As another example, the ceramic body may be prepared by molding and sintering phosphor mixtures, as disclosed in U.S. Publication No. 2009/0212697 and U.S. Application No. 61/315,763, both of which are hereby incorporated by reference in their entirety.

Figures 9A, 9B:
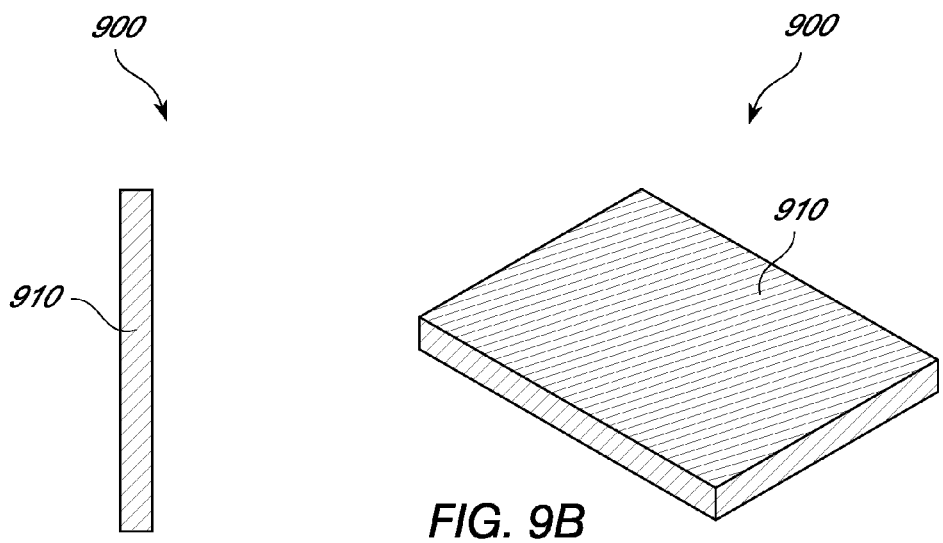
FIGS. 9A-B show one example of an assembly that may be sintered to form a ceramic body.

FIG. 9A is a side view of assembly 900 containing only co-doped layer 910. Co-doped layer 910 can be, for example, one or more laminated sheets or a mold that can be sintered under appropriate conditions to obtain a ceramic body that includes compositions of formula I. FIG. 9B shows a perspective view of assembly 900. In some embodiments, the assembly includes a generally uniform distribution of phosphor components (or precursors thereof) so that, upon sintering, the distribution of dopants in the emissive layer is generally uniform (e.g. a uniform distribution as depicted in FIG. 2).

Figures 10A, 10B:
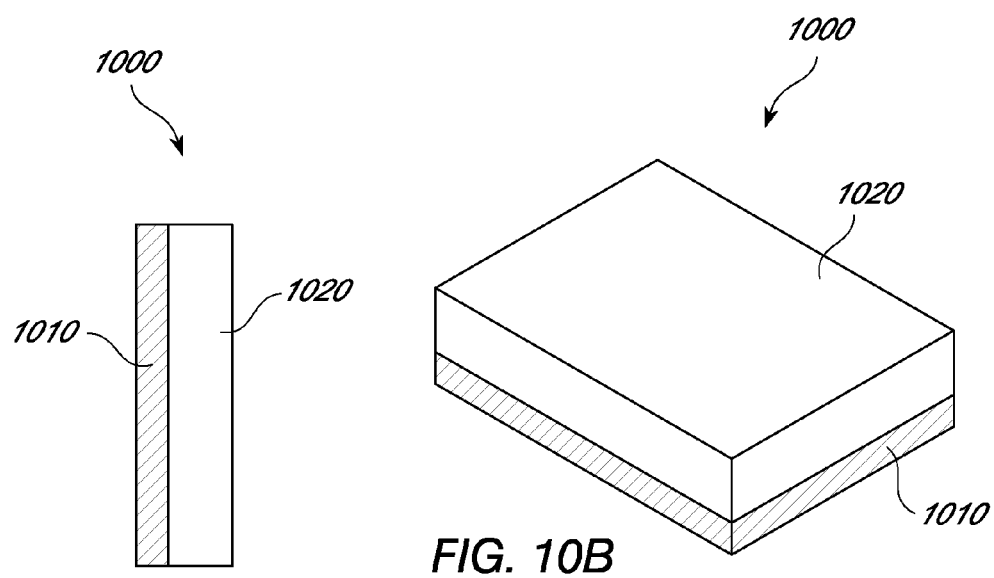
FIGS. 10A-B show one example of an assembly that may be sintered to form a ceramic body.

FIG. 10A is a side view of assembly 1000 having co-doped layer 1010 disposed on one side of layer 1020. FIG. 10B shows a perspective view of assembly 100. Assembly 100 may, for example, be configured and sintered under appropriate conditions to obtain a dopant concentration gradient similar to the one depicted in FIG. 3. Co-doped layer 1010 can be sintered under appropriate conditions to obtain a ceramic body that includes a composition of formula I.

Layer 1020 can include the same host material as co-doped layer 1010. Thus, dopants present in co-doped layer 1010 may diffuse into layer 1020 during sintering. This may form a ceramic body having one or more concentration gradients. For example, co-doped layer 1010 may include $(Y_{0.64}Gd_{0.35}Ce_{0.01})_3Al_5O_{12}$ and layer 1020 may include $(Y_{0.65}Gd_{0.35})_3Al_5O_{12}$. During sintering, Ce may diffuse from co-doped layer 1010 into layer 1020 to produce, for example, the dopant concentration profiles depicted in FIG. 4. In some embodiments, layer 1020 is substantially free of the first dopant (i.e., D in the composition of formula I). In some embodiments, layer 1020 includes no more than trace amounts of the first dopant. In some embodiments, layer 1020 is substantially free of Gd. In some embodiments, layer 1020 includes no more than trace amounts of Gd. In some embodiments, layer 1020 includes Gd but includes no more than trace amounts of the first dopant. In some embodiments, layer 1020 includes Gd but is substantially free of the first dopant. In some embodiments, layer 1020 includes about the same concentration of Gd as the co-doped layer 1020. In some embodiments, layer 1020 is substantially free of the first and second dopants (e.g., D and Gd, respectively, in the composition of formula I). In some embodiments, layer 1020 includes no more than trace amounts of the first and second dopants. In some embodiments, layer 1020 is substantially free of Gd and Ce.

FIGS. 11A and 11B illustrate another embodiment of an assembly that may be sintered according to the methods disclosed herein. FIG. 11A is a side view of assembly 1100 having co-doped layer 1110 interposed between first layer 1120 and second layer 1130. FIG. 11B shows a perspective view of assembly 1100. First layer 1120 and second layer 1130 can have generally the same composition as layer 1020 depicted in FIG. 10. For example, first layer 1120 and second layer 1130 can each include $(Y_{0.65}Gd_{0.35})Al_5O_{12}$, while co-doped layer 1110 can include $(Y_{0.64}Gd_{0.35}Ce_{0.01})_3Al_5O_{12}$. As another example, first layer 1120 and second layer 1130 can each be substantially free of the first and second dopants (e.g., D and Gd, respectively, in the composition of formula I), while co-doped layer 1110 can include materials as set forth in Formula I, e.g., $(Y_{0.64}Gd_{0.35}Ce_{0.01})_3Al_5O_{12}$. In some embodiments, first layer 1120 and second layer 1130 have about the same composition. In some embodiments, first layer 1120 and second layer 1130 include no more than trace amounts of the first and second dopants. In some embodiments, first layer 1120 and second layer 1130 are substantially free of Gd and Ce. In some embodiments, first layer 1120 and second layer 1130 include no more than trace amounts of Gd and Ce, while co-doped layer 1110 can include materials as set forth in Formula I, e.g., $(Y_{0.64}Gd_{0.35}Ce_{0.01})_3Al_5O_{12}$. During sintering, the first dopant (e.g., Ce) and/or the second dopant (e.g., Gd) may diffuse from co-doped layer 1110 into first layer 1120 and second layer 1130 to produce, for example, the dopant concentration profiles depicted in FIG. 7 or FIG. 8 depending on the configuration of the assembly.

In another example, first layer 1110 and second layer 1120 can each be substantially free of the first dopant (i.e., D, in the composition of formula I), while co-doped layer 1110 can include materials as set forth in Formula I, e.g., $(Y_{0.64}Gd_{0.35}Ce_{0.01})_3Al_5O_{12}$. In some embodiments, first layer 1120 and second layer 1130 can include no more than trace amounts of the first dopant. In some embodiments, first layer 1120 and second layer 1130 can are substantially free of Ce. In some embodiments, first layer 1120 and second layer 1130 can include no more than trace amounts of Ce, while co-doped layer 1110 can include materials as set forth in Formula I, e.g., $(Y_{0.64}Gd_{0.35}Ce_{0.01})_3Al_5O_{12}$.

In another example, first layer 1110 and second layer 1120 can each be substantially free of the Gd, while co-doped layer 1110 can include materials as set forth in Formula I, e.g., $(Y_{0.64}Gd_{0.35}Ce_{0.01})_3Al_5O_{12}$. In some embodiments, layer 1020 includes no more than trace amounts of Gd. In some embodiments, layer 1020 is substantially free of Gd. In some embodiments, layer 1020 includes no more than trace amounts of Gd, while co-doped layer 1110 can include materials as set forth in Formula I, e.g., $(Y_{0.64}Gd_{0.35}Ce_{0.01})_3Al_5O_{12}$.

FIGS. 12A and 12B illustrate another embodiment of an assembly that may be sintered according to the methods disclosed herein. FIG. 12A is a side view of assembly 1200 having co-doped layer 1210 disposed between first layer 1220 and second layer 1230. First layer 1220 is disposed between co-doped layer 1210 and third layer 1240. Second layer 1230 is disposed between co-doped layer 1210 and fourth layer 1250. FIG. 12B shows a perspective view of assembly 1100.

First layer 1220 and second layer 1230 can have generally the same composition as described for layer 1020. In some embodiments, first layer 1220 and second layer 1230 have the same composition. In some embodiments, third layer 1240 and fourth layer 1250 may include the same host material as co-doped layer 1210. In some embodiments, third layer 1240 and fourth layer 1250 include no more than trace amounts of the first dopant and Gd. In some embodiments, third layer 1240 and fourth layer 1250 include no more than trace amounts of the first dopant. In some embodiments, third layer 1240 and fourth layer 1250 include no more than trace amounts of Gd. In some embodiments, third layer 1240 and fourth layer 1250 are substantially free of the first dopant and Gd. In some embodiments, third layer 1240 and fourth layer 1250 have the same composition. As one example, first layer 1220 and second layer 1230 can each include $(Y_{0.65}Gd_{0.35})_3Al_5O_{12}$, co-doped layer 1210 can include $(Y_{0.64}Gd_{0.35}Ce_{0.01})_3Al_5O_{12}$, and third layer 1240 and fourth layer 1250 can each include $Y_3Al_5O_{12}$. During sintering, Ce and Gd may diffuse between layers to produce, for example, the dopant concentration profiles depicted in FIG. 8.

In some embodiments, third layer 1240 and fourth layer 1250 can have generally the same composition as described for layer 1020. In some embodiments, third layer 1240 and fourth layer 1250 have the same composition. In some embodiments, first layer 1220 and third layer 1230 may include the same host material as co-doped layer 1210. In some embodiments, first layer 1220 and second layer 1230 include no more than trace amounts of the first dopant and Gd. In some embodiments, first layer 1220 and second layer 1230 include no more than trace amounts of the first dopant. In some embodiments, first layer 1220 and second layer 1230 include no more than trace amounts of the Gd. In some embodiments, first layer 1220 and second layer 1230 are substantially free of the first dopant and Gd. In some embodiments, first layer 1220 and second layer 1230 are substantially free of the first dopant. In some embodiments, first layer 1220 and second layer 1230 are substantially free of Gd. In some embodiments, first layer 1220 and second layer 1230 have the same composition. As one example, third layer 1240 and fourth layer 1250 can each include $(Y_{0.65}Gd_{0.35})_3Al_5O_{12}$, co-doped layer 1210 can include $(Y_{0.64}Gd_{0.35}Ce_{0.01})_3Al_5O_{12}$, and first layer 1220 and second layer 1230 can each include $Y_3Al_5O_{12}$. During sintering, Ce and Gd may diffuse between layers to produce dopant concentration profiles.

The co-doped layer of the assembly can include a host material, host material precursor, or a combination thereof. In some embodiments, the host material is a garnet. In some embodiments, the host material is yttrium aluminum garnet. A "host material precursor" can be any components that will form the host material during the process. As an example, a yttrium aluminum garnet precursor may be a mixture of $Y_2O_3$ and $Al_2O_3$ at the stoichiometric ratio of 3:5 that forms yttrium aluminum garnet during sintering. As used herein, "an equivalent amount of a host material precursor" is the amount of host material that the host material precursor yields after processing. In some embodiments, the co-doped layer includes at least 50% yttrium aluminum garnet by weight and/or its equivalent amount of precursor. In some embodiments, the co-doped layer includes at least 80% yttrium aluminum garnet and/or its equivalent amount of precursor. In some embodiments, the co-doped layer includes at least 90% yttrium aluminum garnet and/or its equivalent amount of precursor. In some embodiments, the co-doped layer consists essentially of yttrium aluminum garnet and the desired dopant.

The co-doped layer also includes first dopant selected from Nd, Er, Eu, Mn, Cr, Yb, Sm, Tb, Ce, Pr, Dy, Ho, Lu and combinations thereof. In some embodiments, the first dopant is Ce. The amount of dopant in the co-doped layer can be an amount effective to impart luminescence upon the ceramic body after sintering is complete. In some embodiments, the co-doped layer includes about 0.1 at % to about 10 at % first dopant with respect to yttrium. The co-doped layer may, for example, include at least about 0.2 at %; at least about 0.4 at %; at least about 0.5 at %; at least about 0.6 at %; at least about 1 at %; at least about 1.5 at %; or at least about 2 at % of the first dopant. The co-doped layer may, for example, include no more than about 10 at %; no more than about 5 at %; no more than about 4 at %; no more than about 3.5 at %; or no more than about 3 at % of the first dopant. In some embodiments, the co-doped layer contains a generally uniform distribution of the first dopant.

The co-doped layer also includes Gd. The amount of Gd in the co-doped layer can be, for example, in the range of about 4 at % to about 80 at % with respect to yttrium. The amount of Gd can be, for example at least about 5 at %; at least about 10 at %; at least about 15 at %; at least about 20 at %; at least about 25 at %; at least about 30 at %; or at least about 35 at %; at least about 40 at %; at least about 45 at %; or at least about 50 at %. The amount of Gd can be, for example, no more than about 80 at %; no more than about 70 at %; no more than about 60 at %; no more than about 50 at %; no more than about 45 at %; or no more than about 40 at %. Non-limiting examples of concentrations for Gd include between about 10 at % and about 35 at %.

The one or more layers (e.g., one, two, three, or four layers) in the assembly (e.g., layers 1220, 1230, 1240, and 1250 depicted in FIGS. 12A and 12B) can also include a host material, host material precursor, or a combination thereof. In some embodiments, the one or more layers include at least 50% by weight host material and/or its equivalent amount of precursor. In some embodiments, the one or more layers include at least 80% host material and/or its equivalent amount of precursor. In some embodiments, the layers include at least 90% host material and/or its equivalent amount of precursor. In some embodiments, the host material in the co-doped layer is the same as the host material in the one or more layers. In some embodiments, the one or more layers consist essentially of the host material, host material precursor, or a combination thereof. The host material in the one or more layers can be, for example, yttrium aluminum garnet. In some embodiments, the one or more layers consist essentially of yttrium aluminum garnet.

The one or more layers may, in some embodiments, be substantially free of the first dopant in the co-doped layer. For example, the co-doped layer having Ce may be disposed between two layers that include no more than trace amounts of Ce. In some embodiments, layers adjacent to the co-doped layer include Gd. The layers adjacent to the co-doped layer may include the same atomic percentage of Gd as in the co-doped layer. For example, the layers may each include $(Y_{0.65}Gd_{0.35})_3Al_5O_{12}$ and the co-doped layer can include $(Y_{0.64}Gd_{0.35}Ce_{0.01})_3Al_5O_{12}$. In some embodiments, at least one layer is substantially free of Gd and the first dopant in the co-doped layer. For example, the co-doped layer can include $(Y_{0.64}Gd_{0.35}Ce_{0.01})_3Al_5O_{12}$, two inner layers adjacent to the co-doped layer can include $(Y_{0.65}Gd_{0.35})_3Al_5O_{12}$, and two outer layers can include $Y_3Al_5O_{12}$. As another example, the co-doped layer can include $(Y_{0.64}Gd_{0.35}Ce_{0.01})_3Al_5O_{12}$, two inner layers adjacent to the co-doped layer can include $Y_3Al_5O_{12}$, and two outer layers can include $(Y_{0.65}Gd_{0.35})_3Al_5O_{12}$. In some embodiments, at least one layer (e.g., one, two, three, four, or more layers) can include an amount of first dopant that is ineffective for imparting luminescence upon the ceramic body. In some embodiments, at least one layer can include less than about 0.05 at % first dopant. In some embodiments, at least one layer can include less than about 0.01 at % first dopant. In some embodiments, at least one layer can include less than about 0.001 at % first dopant.

The relative thickness of the co-doped layer and one or more layers may affect the internal quantum efficiencies. See U.S. Application No. 61/418,725 and Ser. No. 13/306,797, each of which is hereby incorporated by reference, for further discussion of how the thickness can control quantum efficiencies. Accordingly, in some embodiments, the co-doped layer has a thickness configured to enable a reduction of at least the first dopant concentration within the co-doped layer. In some embodiments, the co-doped layer has a thickness configured to enable diffusion of at least the first dopant from the co-doped layer and into the one or more layers. In some embodiments, the co-doped layer has a thickness in the range of about 10 μm to about 500 μm. In some embodiments, the co-doped layer has a thickness in the range of about 40 μm to about 400 μm. The co-doped layer may, for example, have a thickness that is at least about 20 at least about 30 at least about 40 or at least about 50 μm. The co-doped layer may also, for example, have a thickness that is no more than about 200 no more than about 150 no more than about 120 no more than about 100 μm; no more than about 80 μm; or no more than about 70 μm.

The one or more layers (e.g., one, two, three, or four layers) in the assembly (e.g., layers 1220, 1230, 1240, and 1250 depicted in FIGS. 12A and 12B) may each independently have a thickness in the range of about 30 μm to about 800 μm. In some embodiments, the one or more layers may each independently have a thickness in the range of about 40 μm to about 400 μm. The one or more layers may, for example, each independently have a thickness that is at least about 40 μm; at least about 60 μm; at least about 80 μm; at least about 90 μm; at least about 100 μm; at least about 120 μm; at least about 150 μm; at least about 200 μm; or at least about 400 μm. The one or more layers may, for example, each independently have a thickness that is no more than about 800 μm; no more than about 600 μm; no more than about 500 μm; no more than about 400 μm; no more than about 300 μm; no more than about 250 μm; no more than about 200 μm; no more than about 150 μm; or no more than about 120 μm. In some embodiments, at least one layer (e.g., one, two, three, or four layers) may have a thickness less than or equal to the thickness of the co-doped layer. In some embodiments, at least one layer (e.g., one, two, three, or four layers) has a thickness greater than or equal to the thickness of the co-doped layer.

The thickness of the co-doped layer may, for example, be less than the thickness of at least one layer (e.g., 1220, 1230,

1240 and/or 1250 depicted in FIG. 12A). The ratio of the thickness of the at least one layer relative to the thickness of the co-doped layer may, in some embodiments, be in the range of about 20:1 to about 1.5:1. The ratio of the thickness of the at least one layer relative to the thickness of the co-doped layer may, for example, be no more than about 15:1; no more than about 12:1; no more than about 10:1; no more than about 8:1; or no more than about 5:1. The ratio of the thickness of the at least one layer relative to the thickness of the co-doped layer may also, for example, be at least about 2:1; at least about 3:1; at least about 4:1; or at least about 5:1.

The total thickness of the assembly is not particularly limited. In some embodiments, the assembly can have a thickness in the range of about 10 µm to 1 mm. The assembly may have a thickness, for example, of at least about 10 µm; at least about 50 µm; at least about 100 µm; at least about 200 µm; or at least about 250 µm. The assembly may have a thickness, for example, of no more than about 1 mm; no more than about 800 µm; no more than about 600 µm; no more than about 400 µm; or no more than about 300 µm.

Figure 13:
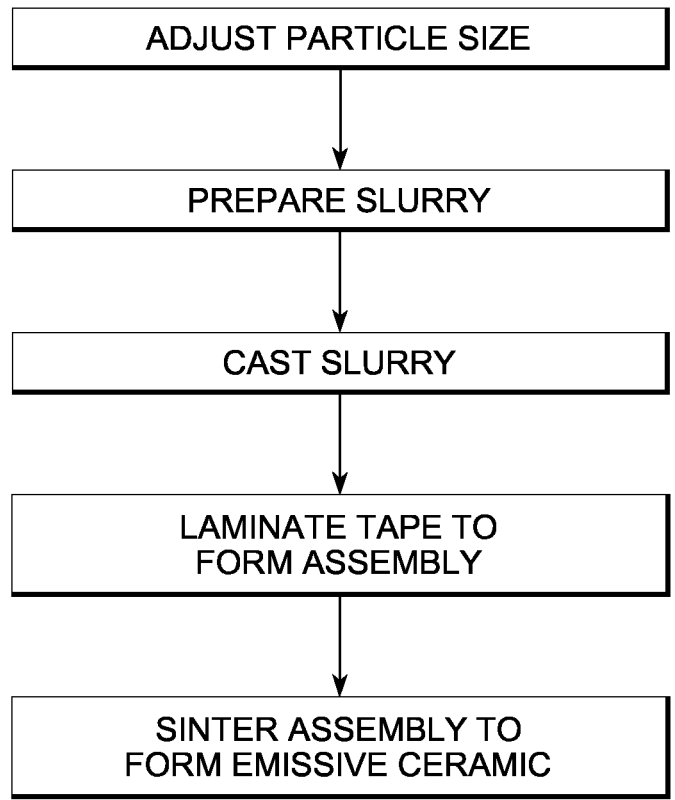
FIG. 13 shows a preparation flow diagram for one embodiment of forming the ceramic body that includes lamination.

FIG. 13 shows a preparation flow diagram for one embodiment of forming the ceramic body that includes lamination. First, the particle size of the raw materials (e.g., nitrate or oxide based raw materials, such as $Y_2O_3$ and $Al_2O_3$ for forming YAG) may optionally be adjusted to reduce cracking in the cast tapes from capillary forces during evaporation of solvents. For example, the particle size can be adjusted by pre-annealing raw material particles to obtain the desired particle size. Raw material particles can be pre-annealed in the temperature range of about 800° C. to about 1800° C. (or more preferably 1000° C. to about 1500° C.) to obtain the desired particle size. The pre-annealing may occur in a vacuum, air, $O_2$, $H_2$, $H_2/N_2$, or a noble gas (e.g., He, Are, Kr, Ex., Run, or combinations thereof). In an embodiment, each of the raw materials (e.g., $Y_2O_3$ and $Al_2O_3$ for forming YAG) is adjusted to be about the same particle size. In another embodiment, the particles have a BET surface area in the range of about 0.5 $m^2/g$ to about 20 $m^2/g$ (preferably about 1.0 $m^2/g$ to about 10 $m^2/g$, or more preferably about 3.0 $m^2/g$ to about 6.0 $m^2/g$).

A slurry may then be prepared for subsequently casting into a tape. Pre-made phosphors (e.g., phosphors prepared by flow-based thermochemical synthetic routes described herein) and/or stoichiometric amounts of raw materials can be intermixed with various components to form a mixture. Examples of components for the mixture include, but are not limited to, dopants, dispersants, plasticizers, binders, sintering aids and solvents.

In some embodiments, small quantities of flux materials (e.g., sintering aids) may be used in order to improve sintering properties of the assembly if desired. In some embodiments, the sintering aids may include, but are not limited to, tetraethyl orthosilicate (TEOS), colloidal silica, lithium oxide, titanium oxide, zirconium oxide, magnesium oxide, barium oxide, calcium oxide, strontium oxide, boron oxide, or calcium fluoride. Additional sintering aids include, but are not limited to, alkali metal halides such as NaCl or KCl, and organic compounds such as urea. In some embodiments, the assembly comprises between about 0.01% and about 5%, between about 0.05% and about 5%, between about 0.1% and about 4%, or between about 0.3% and about 1% by weight of the flux material(s) or sintering aid(s). The sintering aid can be intermixed with the raw materials. For example, in some embodiments, tetraethyl orthosilicate (TEOS) can be added to the raw materials to provide the desired amount of sintering aid. In one embodiment, about 0.05% to about 5% by weight of TEOS is provided in the assembly. In some embodiments, the amount of TEOS may be between about 0.3% and about 1% by weight.

Various plasticizers may also be included, in some embodiments, to reduce the glass transition temperature and/or improve flexibility of the ceramic. Non-limiting examples of plasticizers include dicarboxylic/tricarboxylic ester-based plasticizers, such as bis(2-ethylhexyl) phthalate, diisononyl phthalate, bis(n-butyl)phthalate, butyl benzyl phthalate, diisodecyl phthalate, di-n-octyl phthalate, diisooctyl phthalate, diethyl phthalate, diisobutyl phthalate, and di-n-hexyl phthalate; adipate-based plasticizers, such as bis(2-ethylhexyl)adipate, dimethyl adipate, monomethyl adipate, and dioctyl adipate; sebacate-based plasticizers, such as dibutyl sebacate, and maleate; dibutyl maleate; diisobutyl maleate; polyalkylene glycols such as polyethylene glycol, polypropylene glycol, and copolymers thereof; benzoates; epoxidized vegetable oils; sulfonamides, such as N-ethyl toluene sulfonamide, N-(2-hydroxypropyl)benzene sulfonamide, and N-(n-butyl) benzene sulfonamide; organophosphates, such as tricresyl phosphate, tributyl phosphate; glycols/polyethers, such as triethylene glycol dihexanoate, tetraethylene glycol diheptanoate; alkyl citrates, such as triethyl citrate, acetyl triethyl citrate, tributyl citrate, acetyl tributyl citrate, trioctyl citrate, acetyl trioctyl citrate, trihexyl citrate, acetyl trihexyl citrate, butyryl trihexyl citrate, and trimethyl citrate; alkyl sulphonic acid phenyl ester; and mixtures thereof.

In some embodiments, the process may be made easier by occasionally adding binder resin and solvent to the raw powders. A binder is any substance that improves adhesion of the particles of the composition being heated to form a composite. Some non-limiting examples of binders include polyvinyl alcohol, polyvinyl acetate, polyvinyl chloride, polyvinyl butyral, polystyrene, polyethylene glycol, polyvinylpyrrolidones, polyvinyl acetates, and polyvinyl butyrates, etc. In some, but not all, circumstances, it may be useful for the binder to be sufficiently volatile that it can be completely removed or eliminated from the precursor mixture during the sintering phase. Solvents which may be used include, but not limited to water, a lower alkanol such as but not limited to denatured ethanol, methanol, isopropyl alcohol and mixtures thereof, preferably denatured ethanol, xylenes, cyclohexanone, acetone, toluene and methyl ethyl ketone, and mixtures thereof. In a preferred embodiment, the solvent is a mixture of xylenes and ethanol.

In some embodiments, the dispersants can be Flowen, fish oil, long chain polymers, steric acid, oxidized Menhaden fish oil, dicarboxylic acids such succinic acid, orbitan monooleate, ethanedioic acid, propanedioic acid, pentanedioic acid, hexanedioic acid, heptanedioic acid, octanedioic acid, nonanedioic acid, decanedioic acid, o-phthalic acid, p-phthalic acid and mixtures thereof.

The mixture may then be subjected to comminution to form a slurry by, for example, ball milling the mixture for a time period in the range of about 0.5 hrs. to about 100 hrs. (preferably about 6 hrs. to about 48 hrs., or more preferably about 12 hrs. to about 24 hrs.). The ball milling may utilize milling balls that include materials other than the components intermixed within the mixture (e.g., the milling balls may be $ZrO_2$ for a mixture that forms YAG). In an embodiment, the ball milling includes isolating the milling balls after a period of time by filtration or other known methods of isolation. In some embodiments, the slurry has a viscosity in the range of about 10 cP to about 5000 cP (preferably about 100 cP to about 3000 cP, or more preferably about 400 cP to 1000 cP).

Third, the slurry may be cast on a releasing substrate (e.g., a silicone coated polyethylene teraphthalate substrate) to form a tape. For example, the slurry may be cast onto a moving carrier using a doctor blade and dried to form a tape. The thickness of the cast tape can be adjusted by changing the gap between the doctor blade and the moving carrier. In some embodiments, the gap between the doctor blade and the moving carrier is in the range of about 0.125 mm to about 1.25 mm (preferably about 0.25 mm to about 1.00 mm, or more preferably about 0.375 mm to about 0.75 mm). Meanwhile, the speed of the moving carrier can have a rate in the range of about 10 cm/min. to about 150 cm/min. (preferably about 30 cm/min. to about 100 cm/min., or more preferably about 40 cm/min. to about 60 cm/min.). By adjusting the moving carrier speed and the gap between the doctor blade and moving carrier, the tape can have a thickness between about 20 μm and about 300 μM. The tapes may optionally be cut into desired shapes after casting.

Two or more tapes can be laminated to form the assembly. The lamination step can include stacking two or more tapes (e.g., 2 to 100 tapes are stacked) and subjecting the stacked tapes to heat and uniaxial pressure (e.g., pressure perpendicular to the tape surface). For example, the stacked tapes may be heated above the glass transition temperature ($T_g$) of the binder contained in the tape and compressed uniaxially using metal dies. In some embodiments, the uniaxial pressure is in the range of about 1 to about 500 MPa (preferably about 30 MPa to about 60 MPa). In some embodiments, the heat and pressure is applied for a time period in the range of about 1 min. to about 60 min. (preferably about 15 min. to about 45 min., or more preferably about 30 min.). The lamination step may optionally include forming various shapes (e.g., holes or pillars) or patterns into the assembly by, for example, using shaped dies.

Some embodiments of the assembly include at least one or more tapes that include the composition of formula I, or a precursor thereof. The one or more tapes may be laminated together to form an assembly. The assembly may, in some embodiments, exclude other layers (e.g., assembly 910 depicted in FIG. 9). In some embodiments, the assembly can also include one or more layers that are different from the co-doped layer. The one or more layers can each include one or more tapes. For example, the assembly may include a co-doped layer having a layer on one side that includes a host material, or its precursor. As another example, the assembly may include a co-doped layer having a layer on one side that includes a host material, or its precursor, doped with Gd. Of course, the tapes can be stacked in various configurations, such as any of those depicted in FIGS. 9-12. The thickness of the co-doped layer and one or more layers can be modified by changing the number of tapes in the assembly. For example, to obtain a thicker co-doped layer, additional layers of tape can be added to the assembly having a composition of formula I.

The methods disclosed herein can include sintering the assembly to obtain the ceramic body. As would be appreciated by the skilled artisan, guided by the teachings of the present application, the configuration of the assembly can control the concentration profiles within the ceramic body. Also, the sintering conditions, such as the temperature and time, may affect the concentration profiles.

The assembly and sintering conditions may optionally be configured such that a portion of the first dopant diffuses out of the co-doped layer during the process. For example, the first dopant may diffuse into an adjacent layer in the assembly. In some embodiments, at least 30% of the first dopant diffuses out of the co-doped layer during the process. In some embodiments, at least 40% of the first dopant diffuses out of the co-doped layer during the process. In some embodiments, at least 50% of the first dopant diffuses out of the co-doped layer during the process. In some embodiments, at least 60% of the first dopant diffuses out of the co-doped layer during the process. In some embodiments, at least 70% of the first dopant diffuses out of the co-doped layer during the process.

The assembly and sintering conditions may also be optionally configured such that a portion of Gd diffuses out of the co-doped layer during the process. For example, Gd may diffuse into an adjacent layer in the assembly. In some embodiments, at least 5% of Gd diffuses out of the co-doped layer during the process. In some embodiments, at least 10% of Gd diffuses out of the co-doped layer during the process. In some embodiments, no more than 70% of Gd diffuses out of the co-doped layer during the process. In some embodiments, no more than 50% of Gd diffuses out of the co-doped layer during the process. In some embodiments, no more than 30% of Gd diffuses out of the co-doped layer during the process. In some embodiments, no more than 20% of Gd diffuses out of the co-doped layer during the process.

The sintering conditions may also be adjusted to control the maximum first dopant concentration in the ceramic body relative to the initial maximum first dopant concentration of the co-doped layer in the assembly (e.g., before sintering). For example, an assembly having a 0.5 at % Ce doped layer may be sintered to produce an emissive layer having a first dopant concentration gradient with a maximum dopant concentration of about 0.25 at % Ce. Thus, in this case, the maximum first dopant concentration is about 50% of the initial maximum first dopant concentration in the co-doped layer. In some embodiments, the first dopant concentration gradient of the emissive layer includes a maximum first dopant concentration that is no more than about 65% of the initial first dopant concentration in the doped layer of the assembly. The first dopant concentration gradient of the emissive layer may also include, for example, a maximum first dopant concentration that is no more than about 60% of the initial first dopant concentration in the co-doped layer of the assembly; no more than about 55% of the initial first dopant concentration in the co-doped layer of the assembly; no more than about 50% of the initial first dopant concentration in the co-doped layer of the assembly; no more than about 40% of the initial first dopant concentration in the co-doped layer of the assembly; or no more than about 25% of the initial first dopant concentration in the co-doped layer of the assembly.

Prior to sintering, an optional debinding process may be completed. The debinding process includes decomposing at least a portion of organic components within the assembly (e.g., volatilize binders and plasticizers within the assembly). As an example, the assembly may be heated in air to a temperature in the range of about 300° C. to about 1200° C. (preferably about 500° C. to about 1000° C., or more preferably about 800° C.) at a rate of about 0.1° C./min. to about 10° C./min. (preferably about 0.3° C./min. to about 5° C./min., or more preferably about 0.5° C./min. to about 1.5° C./min). The heating step may also include maintaining the temperature for a time period in the range of about 30 min. to about 300 min., which may be selected based upon the thickness of the assembly.

The assembly may be sintered in a vacuum, air, $O_2$, $H_2$, $H_2/N_2$, or a noble gas (e.g., He, Are, Kr, Ex., Run, or combinations thereof) at a temperature in the range of about 1200° C. to about 1900° C. (preferably about 1300° C. to about 1800° C., or more preferably about 1350° C. to about 1700° C.) for a time period in the range of about 1 hr. to about 60 hrs (preferably about 2 hrs. to about 10 hrs.). In some embodiments, the debinding and sintering processes are completed in a single step.

The assembly may be sandwiched between cover plates during the heating step to reduce distortion (e.g., warping, cambering, bending, etc.) of the assembly. The cover plates may include materials having a melting point above the temperatures applied during the heating step. Moreover, the cover plate may be sufficiently porous to permit transport of volatilized components through the covering plates. As an example, the covering plate may be zirconium dioxide having a porosity of about 40%.

Lighting Apparatus and Methods of Using the Emissive Ceramic

Some embodiments provide a lighting apparatus having a light source and a ceramic body configured to receive at least a portion of the radiation emitted by the light source. The ceramic body may include a composition of formula I, such as any of those disclosed above.

The light source may, in some embodiments, be configured to emit blue radiation. The blue radiation may, for example, have a wavelength of peak emission between about 360 nm and about 500 nm. In some embodiments, the light source emits radiation having a wavelength of peak emission between about 450 nm and about 500 nm. Some embodiments include a light source that is a semiconductor LED. As an example, the light source may be an AlInGaN based single crystal semiconductor material coupled to an electric source.

Figure 14:
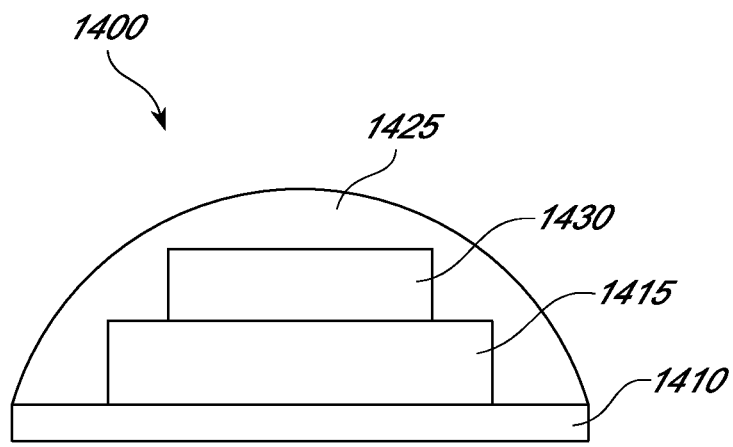
FIG. 14 is an example of a lighting apparatus that may include the ceramic body disclosed herein.

FIG. 14 is an example of a lighting apparatus that may include the ceramic body disclosed herein. A submount 1410 has a light source 1415, such as a conventional base LED mounted thereon. The light source 1415 is adjacent to emissive layer 1430 which receives at least a portion of the light emitted from the light source 1415. An optional encapsulant resin 1425 is placed over the light source 1415 and the emissive layer 1430. Emissive layer 1430 can include any of the ceramic bodies disclosed in the present application.

In some embodiments, the lighting apparatus includes the ceramic body between a p-type region and an n-type region. The ceramic body may in some embodiments, have an emissive layer disposed between two non-emissive layers. The non-emissive layers can be, for example, alumina.

Also disclosed herein are methods of producing light that include exposing any of the ceramic bodies disclosed in the present application to a blue radiation. The blue radiation may, for example, have a wavelength of peak emission between about 360 nm and about 500 nm. In some embodiments, the blue radiation has a wavelength of peak emission between about 450 nm and about 500 nm.

EXAMPLES

Additional embodiments are disclosed in further detail in the following examples, which are not in any way intended to limit the scope of the claims.

Example 1

(a) $(Y_{0.635}Ce_{0.015}Gd_{0.35})_3Al_5O_{12}$ Layers 1.826 g of Yttrium (III) nitrate hex hydrate (99.9% pure, Sigma-Aldrich), 4.756 g of Aluminum nitrate nonahydrate (98.6% pure, Sigma-Aldrich), 1.185 g of Gadolinium nitrate hex hydrate (99.9% pure, Sigma-Aldrich), and 0.049 g of Cerium (III) nitrate hexahydrate (99.99% pure, Sigma-Aldrich) were dissolved in deionized water, followed by ultrasonication for 30 min to prepare a completely transparent solution.

This precursor solution of 2.0M concentration was carried into a plasma reaction chamber similar to that shown in patent publication WO2008112710 A1 via an atomization probe using a liquid pump. The principle, technique and scope taught in the patent publication WO2008112710, which published in English and designated the United States, is hereby incorporated by reference in its entirety.

The synthesis process was conducted with a RF induction plasma torch (TEKNA Plasma System, Inc PL-35) using a Lepel RF Power Supply operating at 3.3 MHz. For the synthesis experiments, the chamber pressure was kept around 25 kPa-75 kPa, and the RF generator plate power was in the range of 10-30 kW. Both the plate power and the chamber pressure are user-controlled parameters. Argon was introduced into the plasma torch as both a swirling sheath gas (20-100 slm) and a central plasma gas (10-40 slm). Sheath gas flow was supplemented by addition of hydrogen (1-10 slm). Reactant injection was performed using a radial atomization probe (TEKNA Plasma System, Inc SDR-772) which operates on the principle of two-fluid atomization. The probe was positioned at the center of the plasma plume during reactant injection. The reactants were fed into the plasma plume by in-situ atomization at a rate of 1-50 ml/min during synthesis. Atomization of the liquid reactant was performed with Argon as atomizing gas delivered at a flow rate of 1-30 slm. The reactants when passing through the hot zone of the RF thermal plasma underwent a combination of evaporation, decomposition and nucleation. The nucleated particles were collected from the flow stream onto suitable porous ceramic or glass filters.

Plasma synthesis yielded $(Y_{0.635}Ce_{0.015}Gd_{0.35})_3Al_5O_{12}$ powder containing 1.5 at % cerium and 35 at % gadolinium with respect to yttrium. The 5 g of the powder was added to a high purity alumina combustion boat and annealed in a tube furnace (MTI GSL 1600) at 1250° C. for 2 hrs under a flowing gas mixture of 3% $H_2$ and 97% $N_2$. The annealed YAG:Ce,Gd powder exhibited a BET of about 4.9 $m^2/g$ and was used to form the co-doped layer in the assembly.

(b) $Y_3Al_5O_{12}$ Layers

A solid state reaction was used to form $Y_3Al_5O_{12}$ while heating the assembly (e.g., during sintering). The following components were included in certain these layers: (i) $Y_2O_3$ powder (2.853 g, 99.99%, lot N-YT4CP, Nippon Yttrium Company Ltd.) with a BET surface area of 4.6 $m^2/g$; and (ii) $Al_2O_3$ powder (2.147 g, 99.99%, grade AKP-30, Sumitomo Chemicals Company Ltd.) with BET surface area of 5.6 $m^2/g$. Components (i) and (ii) were used at a molar ratio of 3:5. No Ce or Gd was included.

(c) $(Y_{0.65}Gd_{0.35})_3Al_5O_{12}$ Layers

A solid state reaction was used to form $(Y_{0.65}Gd_{0.35})_3Al_5O_{12}$ while heating the assembly (e.g., during sintering). The following components were included in certain these layers: (i) $Y_2O_3$ powder (1.654 g, 99.99%, lot N-YT4CP, Nippon Yttrium Company Ltd.) with a BET surface area of 4.6 $m^2/g$; (ii) $Al_2O_3$ powder (1.915 g, 99.99%, grade AKP-30, Sumitomo Chemicals Company Ltd.) with a BET surface area of 5.6 $m^2/g$; and (iii) 1.430 g plasma synthesized $Gd_2O_3$ with a BET surface area of 3.0 $m^2/g$. Components (i), (ii), and (iii) were used at a mole ratio of Y:Gd:Al equal to 1.95:1.05:5. No Ce was included in the reaction.

(d) Forming Assembly

A 50 ml high purity $Al_2O_3$ ball mill jar was filled with 20 g $Y_2O_3$ stabilized $ZrO_2$ balls of 3 mm diameter. Then 5 g of one of the powder mixtures prepared above, 0.10 g dispersant (Flowlen G-700. Kyoeisha), 0.35 g of poly(vinyl butyral-co-vinyl alcohol-co-vinyl acetate) (Aldrich), 0.175 g Benzyl n-butyl phthalate (98%, Alfa Aesar) and 0.175 g polyethylene glycol (Mn=400, Aldrich), 0.025 g tetraethyl orthosilicate as sintering aids (Fluka), 1.583 g xylene (Fisher Scientific, Laboratory grade) and 1.583 g ethanol (Fisher Scientific, reagent alcohol) were added in the jar. The slurry was produced by ball milling the mixture for 24 hours.

After completing the ball milling, the slurry was passed through a metal screen filter with a pore size of 0.05 mm using a syringe. The obtained slurry was cast on a releasing substrate, e.g., silicone coated Mylar® carrier substrate (Tape Casting Warehouse) with an adjustable film applicator (Paul N. Gardner Company, Inc.) at a cast rate of 30 cm/min. The blade gap on a film applicator was set to obtain the desired thickness. Each cast tape was dried at ambient atmosphere for overnight to produce green sheet.

Dried cast tape comprising plasma $(Y_{0.635}Ce_{0.015}Gd_{0.35})_3Al_5O_{12}$ (1.5 at % Ce, 35 at % Gd), SSR YAG (0 at % Ce), or SSR YAG: Gd (0 at % Ce, 35 at % Gd) powders were cut into a circular shape having a 13 mm diameter using a metal puncher. In one lamination, one piece of plasma $(Y_{0.635}Ce_{0.015}Gd_{0.35})_3Al_5O_{12}$ (1.5 at % Ce, 35 at % Gd) cut cast tape (60 μm thickness) was placed between two pieces of SSR YAG cut cast tapes (110 μm thickness for each piece). The layered composite was placed between circular dies with mirror-polished surfaces and heated on hot plate to 80° C., then compressed using a hydraulic press machine at a uniaxial pressure of 5 tons for about 5 minutes. The final assembly had a co-doped layer sandwiched between two non-doped layers.

A second assembly was prepared including one piece of plasma $(Y_{0.985}Ce_{0.015})_3Al_5O_{12}$ (1.5 at % Ce, 0 at % Gd) cut cast tape (60 μm thickness) and two pieces of SSR YAG cut cast tapes (110 μm for each piece) were layered together and processed similarly as described above to get the laminated composite.

(e) Sintering the Assembly

The assemblies were sandwiched between $ZrO_2$ cover plates (1 mm in thickness, grade 42510-X, ESL Electroscience Inc.) and placed on an $Al_2O_3$ plate having a 5 mm thickness. The assemblies were then heated in a tube furnace in air at rate of 0.5° C./min to 800° C. and held for 2 hours to remove the organic components from the assembly.

After debinding, the assembly was annealed at 1500° C. in a vacuum of $10^{-1}$ Torr for 5 hours at a heating rate of 1° C./min to complete conversion from non-garnet phases of YAG in the layers, including, but not limited to amorphous yttrium oxides, YAP, YAM or $Y_2O_3$ and $Al_2O_3$ to yttrium aluminum garnet (YAG) phase, and increase the YAG grain size.

Following the first annealing, the assembly was further sintered in vacuum of $10^{-3}$ Torr at 1700° C. for 5 hours at heating rate of 5° C./min and cooling rate of 10° C./min to room temperature to produce a transparent/translucent YAG ceramic sheet. When the laminated green sheets are annealed in the furnace with graphite heater, the assemblies were embedded in sacrifice YAG powders of 1 μm to 5 μm to prevent the samples from being partially reduced to constituent metals due to the strong reducing atmosphere. Brownish sintered ceramic bodies were reoxidized in furnace at vacuum atmosphere at 1400° C. for 2 hrs. at heating and cooling rates of 10° C./min and 20° C./min, respectively. The ceramic bodies exhibited a transmittance greater than 70% at 800 nm.

(f) Optical Performance Measurements

Each ceramic sheet was diced into 2 mm×2 mm using a dicer (MTI, EC400). Optical measurements were performed using an Otsuka Electronics MCPD 7000 multi channel photo detector system together with required optical components such as optical fibers (Otsuka Electronics), 12 inch diameter integrating spheres (Gamma Scientific, GS0IS12-TLS), calibration light source (Gamma Scientific, GS-IS12-OP1) configured for total flux measurement, and excitation light source (Cree blue-LED chip, dominant wavelength 455 nm, C455EZ1000-S2001).

Figure 15A:
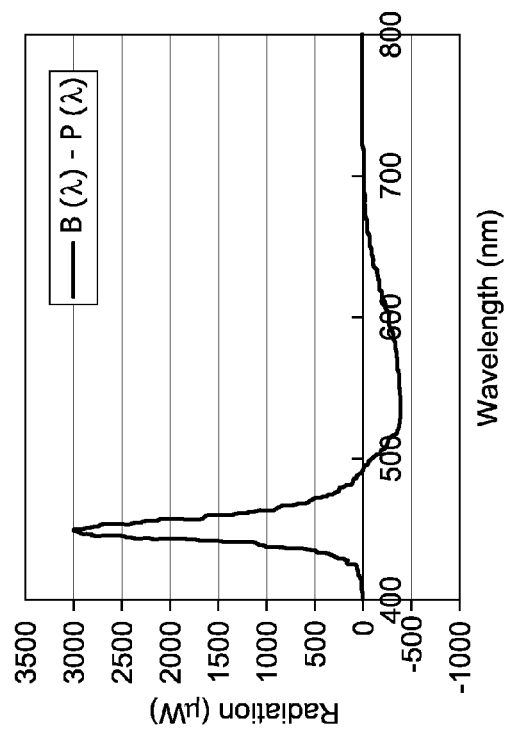
FIG. 15A-B is an example of how the Internal Quantum Efficiency (IQE) can be determined.
Figure 15B:
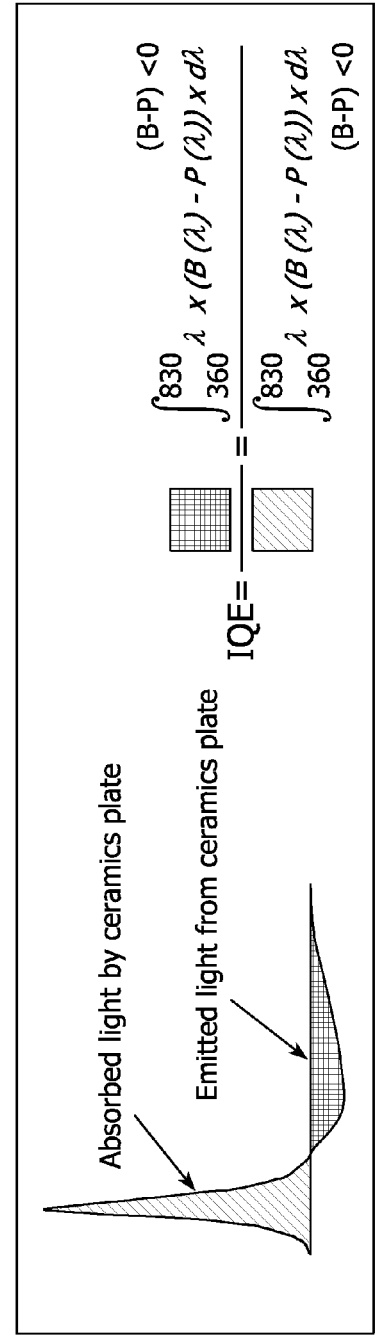

Both ceramic bodies prepared according to the methods above were placed on a light emitting diode (LED) with peak wavelength at 455 nm and an acrylic lens with a refractive index of about 1.45. An LED with the ceramic body was set up inside the integration sphere. The ceramic body was irradiated by the LED with a driving current of 100 mA. The optical radiation of the blue LED with the ceramic body was recorded. Next, the ceramic body was removed from the LED and the radiation for only the blue LED with the acrylic lens was measured. IQE was calculated by integration of the radiation difference from the blue only LED and blue LED/ceramic body combination. IQE was calculated by integration of the radiation difference from the blue only LED and blue LED/ceramic body combination as shown in FIG. 15.

(g) Results

The optical measurements for the two ceramic bodies are shown in TABLE 1. Adding 35 at % Gd into the 1.5 at % Ce YAG ceramic body produces a red shift of 7 nm (from 538 nm to 545 nm) for the wavelength of peak emission. Furthermore, the 35 at % Gd ceramic body showed comparable quantum efficiencies relative to the ceramic body without gadolinium.

TABLE 1

|  | YAG:Ce,Gd (1.5 at % Ce, 0 at % Gd) | YAG (1.5 at % Ce, 35 at % Gd) |
|---|---|---|
| Peak wavelength (nm) | 538 nm | 545 nm |
| CIE y | 0.405 | 0.362 |
| IQE | 74.7% | 74.8% |

Figure 16A:
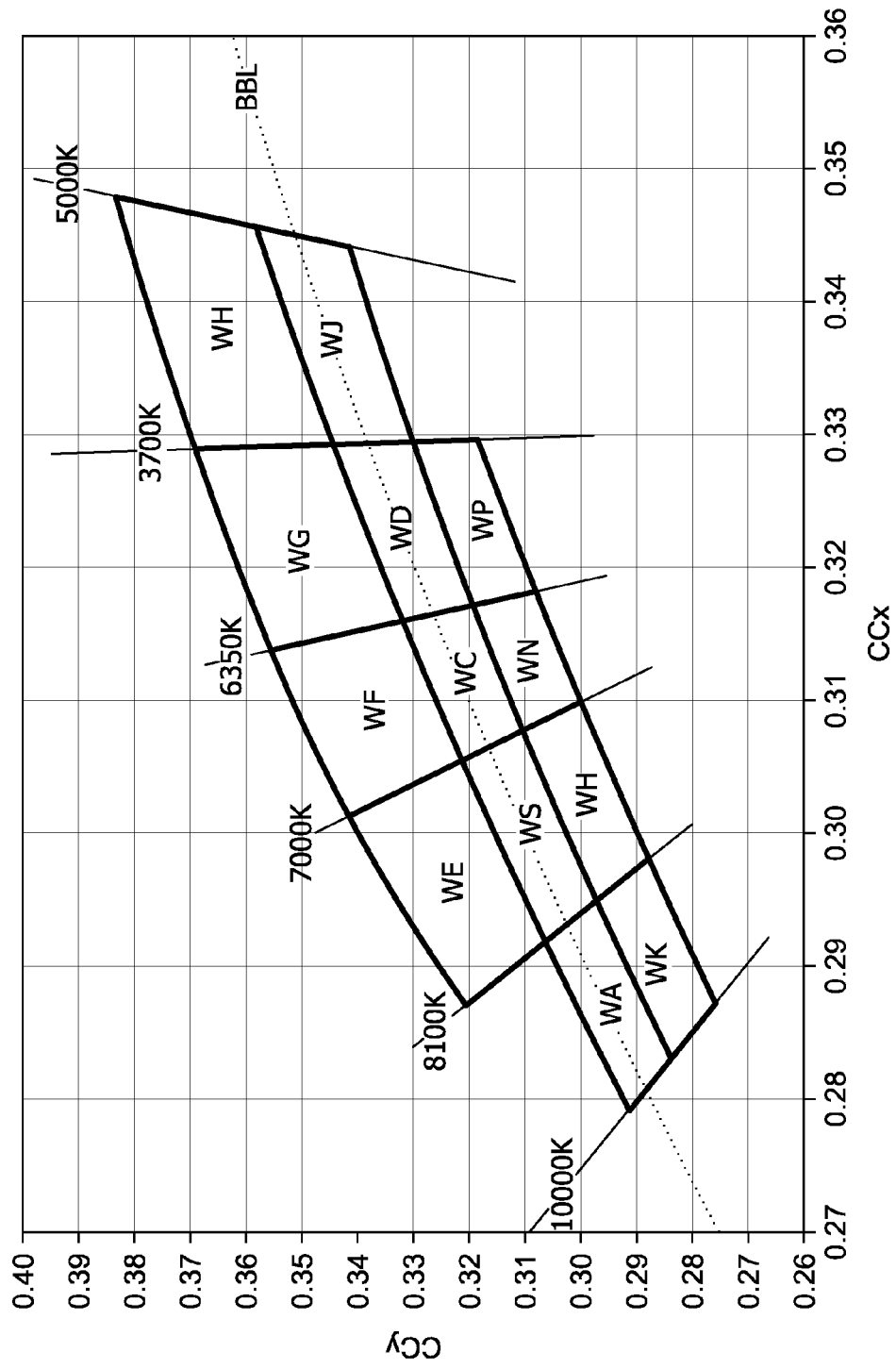
FIG. 16A shows a commercial standard for white bin classifications of cool white light at different color temperatures utilized by Cree Corp.
Figure 16B:
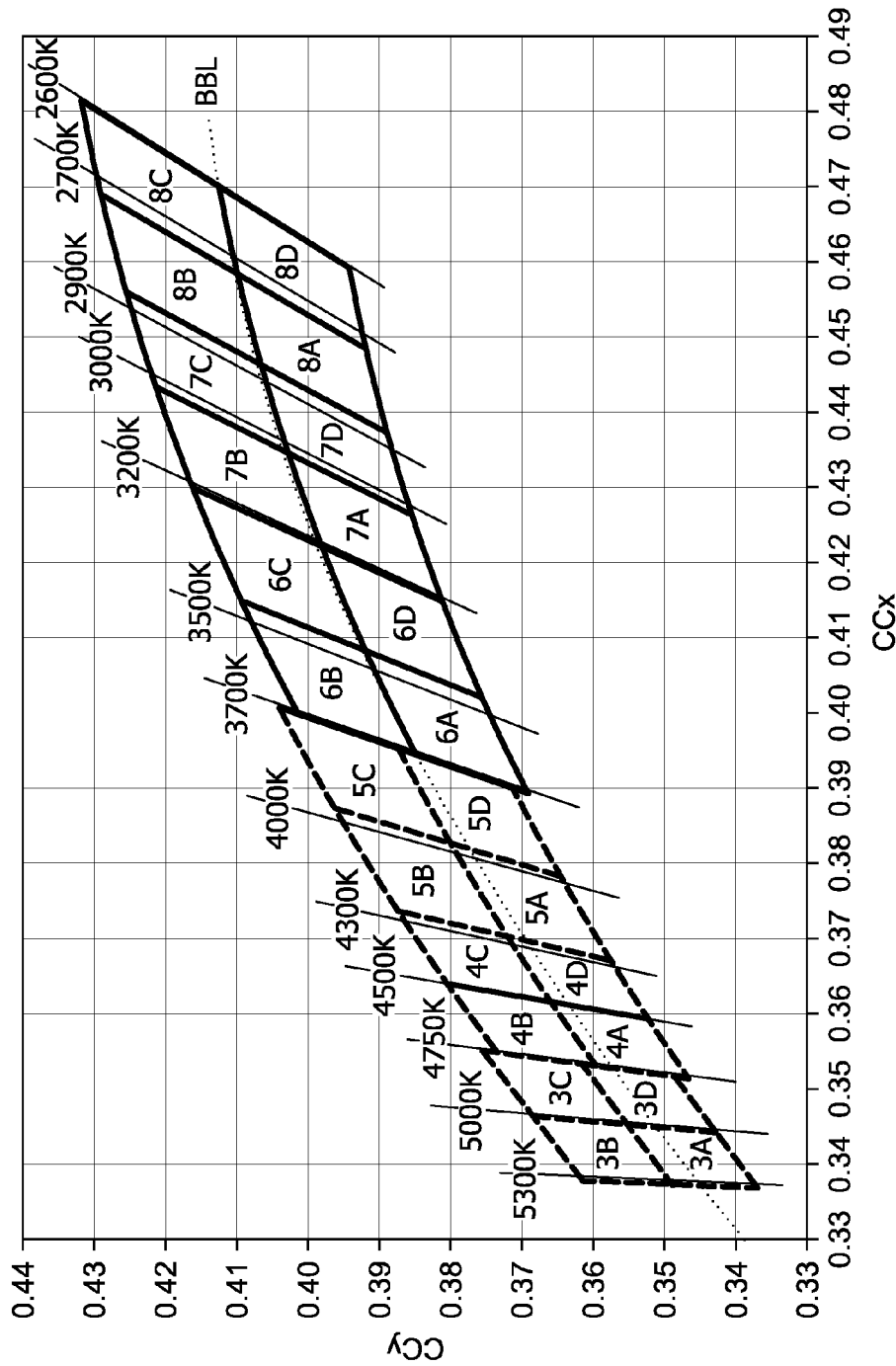
FIG. 16B shows a commercial standard for white bin classifications of neutral and warm white light at different color temperatures utilized by Cree Corp.
Figure 17:
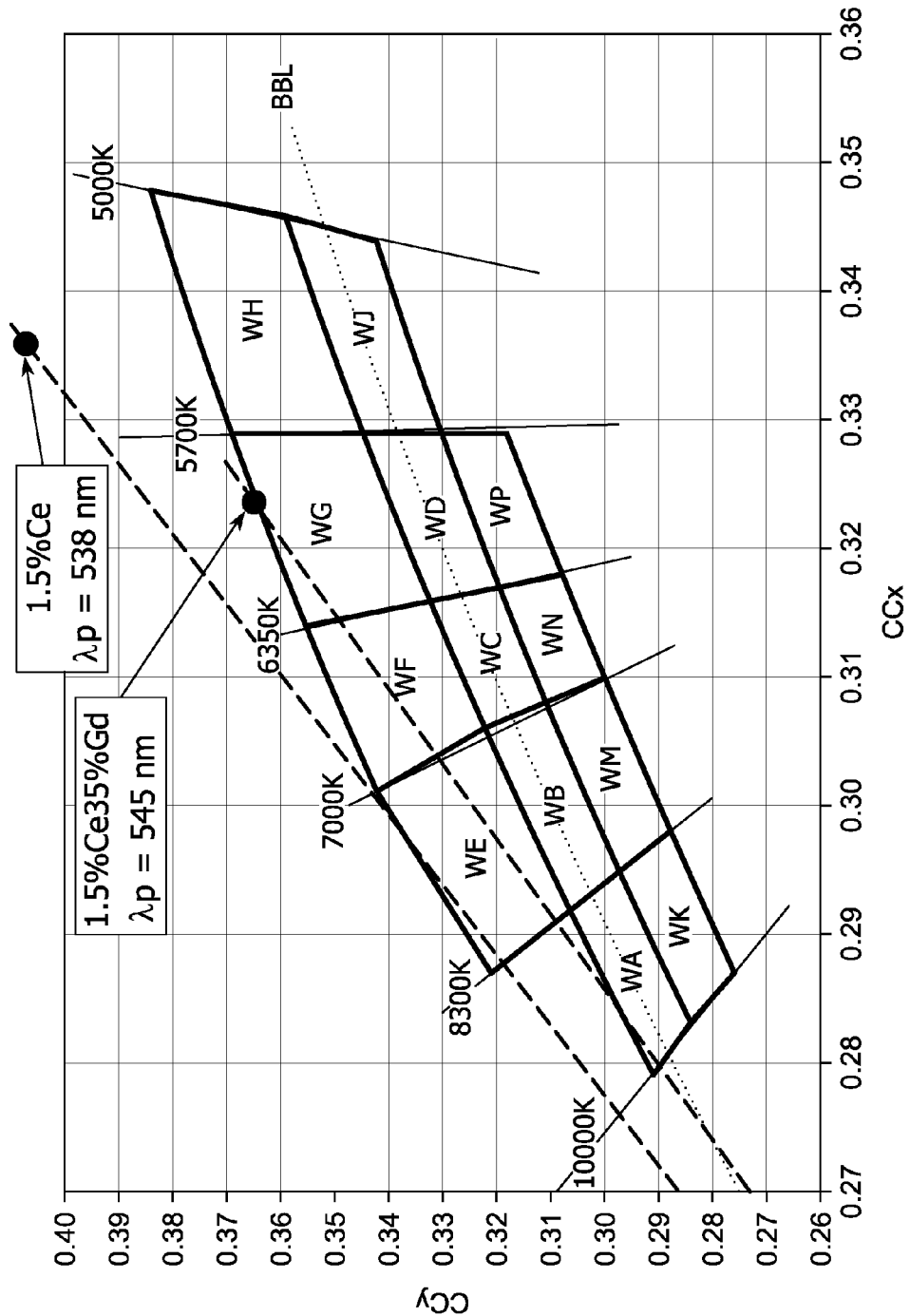
FIG. 17 shows the expected white bin classifications for a ceramic body having a composition of formula I.

FIGS. 16A-B show a commercial standard for white bin classifications at different color temperatures utilized by Cree Corp. FIG. 17 shows that adding 35 at % Gd improves chromaticity for the white LED device. On the CIE chart, for a ceramic with a certain peak wavelength, when changing thickness of the YAG ceramic, the relevant output color can be bluish or yellowish. If plotting a line between the pure blue wavelength (e.g. 455 nm) and pure yellow wavelength (e.g. 538 nm), the chromaticity of YAG-LED can move along the line when adjusting the thickness of YAG ceramic. For the case of 1.5 at % Ce ceramic, it had peak wavelength of 538 nm. FIG. 16 indicates that for the 538 nm emission, the line between yellow and blue was basically out of the white bin regions. On the other hand, when 35 at % Gd was added, the emission peak wavelength shifted to 545 nm and the corresponding line between blue and yellow crossed the white bins WE, WF and WG. This indicates that the addition of 35 at % Gd made the YAG ceramic chromatically acceptable by market standards.

Example 2

Conventionally, LED-YAG combination has been manufactured based on the configuration of yellow light emitting YAG phosphor powder dispersed in plastic encapsulant resin, such as epoxy and silicone. However, since the particle size of YAG phosphor powder is around 1-10 μm, the YAG powder dispersed encapsulant resin medium shows light scattering property. This leads to considerable portion of the incident light from blue LED and yellow emitting light out of YAG to be back scattered and dissipated as a loss of white light emission.

Figure 18:
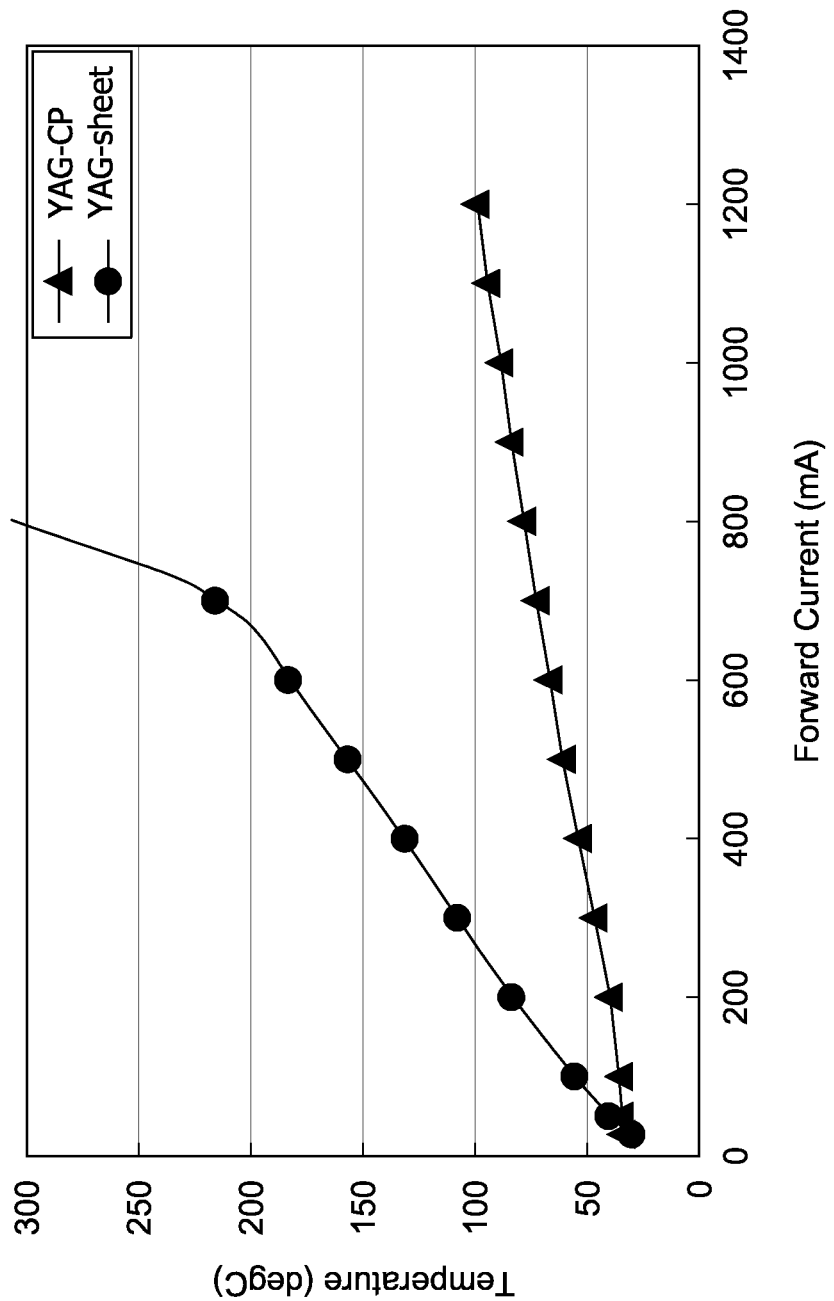
FIG. 18 shows the measured temperature of $(Y_{0.985}Ce_{0.015})_3Al_5O_{12}$ powder dispersed in a resin or $(Y_{0.985}Ce_{0.015})_3Al_5O_{12}$ within a ceramic body. "YAG-sheet" represents the temperature profile for a YAG powder dispersed in an epoxy. "YAG-CP" represents the temperature profile for a YAG ceramic body.

In addition, the YAG powder is connected through a polymer resin, which has much lower thermal conductivity compared with that of YAG, the YAG powder exhibits much higher temperatures. This is true especially for the case of high powder LED, where high driving current such as 1A is applied. As can be seen from FIG. 18, when $(Y_{0.985}Ce_{0.015})_3Al_5O_{12}$ powder dispersed in a resin sheet was placed onto an LED (YAG-sheet in FIG. 18), the measured temperature at 800 mA was already 300° C. Meanwhile, for the case of $(Y_{0.985}Ce_{0.015})_3Al_5O_{12}$, the ceramic body does not include any polymer; therefore, the ceramic body (YAG-CP in FIG. 18) has a temperature of about 80° C. at the same driving current.

A $(Y_{0.635}Ce_{0.015}Ge_{0.35})_3Al_5O_{12}$ powder is also prepared and encapsulated in a resin sheet. This powder is placed on the same LED and exposed to light produced at the same driving currents shown in FIG. 18. It is anticipated that this Gd-doped YAG powder will exhibit a similar temperature profile to $(Y_{0.985}Ce_{0.015})_3Al_5O_{12}$ powder dispersed in a resin sheet.

Example 3

Figure 19A:
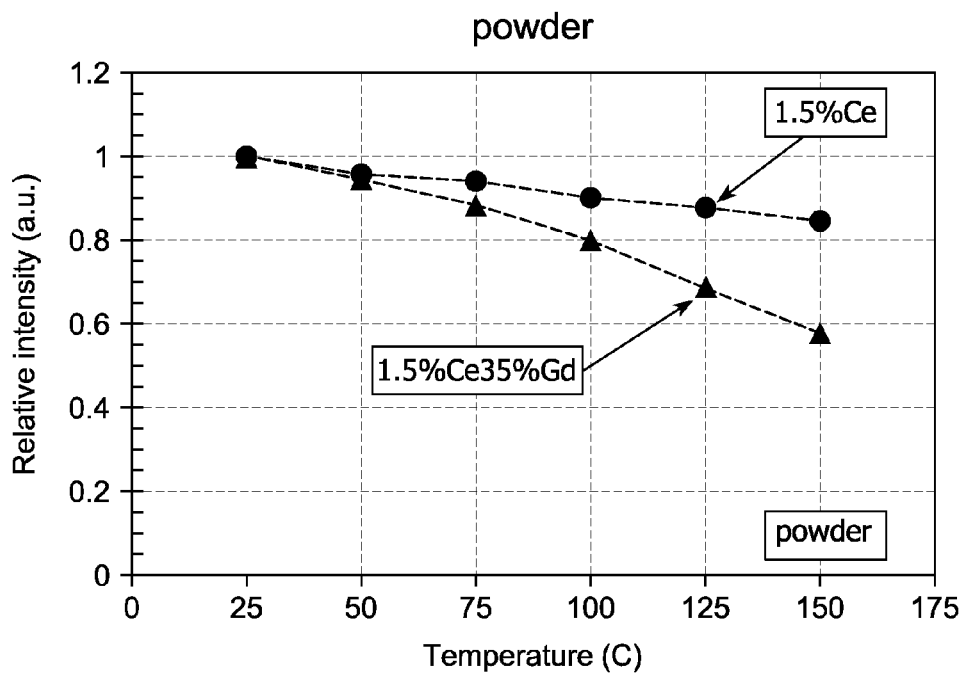
FIG. 19A shows the relative emission intensity at different temperatures for various emissive powder materials.
Figure 19B:
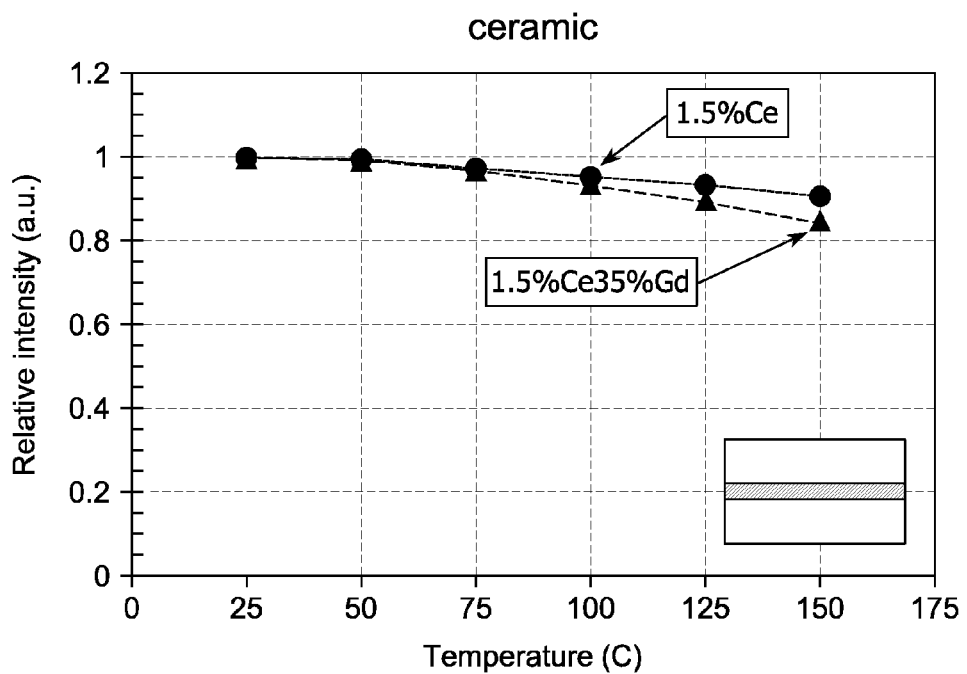
FIG. 19B shows the relative emission intensity at different temperatures for various ceramic emissive materials.

Several devices were constructed as described in Examples 1 and 2 (1.5 at % Ce YAG powder $((Y_{0.985}Ce_{0.015})_3Al_5O_{12})$ and 1.5 at % Ce, 35 at % Gd YAG powder $((Y_{0.635}Ce_{0.015}Gd_{0.35})_3Al_5O_{12})$, 1.5 at % Ce YAG ceramic $((Y_{0.985}Ce_{0.015})_3Al_5O_{12})$ and 1.5 at % Ce, 35 at % Gd YAG ceramic $((Y_{0.635}Ce_{0.015}Gd_{0.35})_3Al_5O_{12})$. The relative intensity of each device and the temperature of the device was measured. FIG. 19A shows a decrease in relative intensity of a device with 1.5% Ce and 1.5% Ce, 35% Gd powder, for example a drop of about 30% (5.8/8.2) at about 150° C. FIG. 19B shows an improved relative intensity for ceramic emissive layers comprising the same dopant concentrations as described in FIG. 19A of about 5% (8.2/8.6) at 150° C. In addition, since at the same driving current, the temperature of a powder embodiment (about 150° C.) is much higher than that of a ceramic embodiment (about 55° C.), see FIG. 18, the relative efficiency of a ceramic embodiment compared to a powder embodiment is about 167%.

In summary, due to the lower device temperature and weaker thermal quenching, a ceramic body including 35 at % Gd is anticipated to exhibit about 150% relative intensity (8.2/5.8=141.4%) compared to a 35 at % Gd powder at the same driving current Example 4

Figure 20:
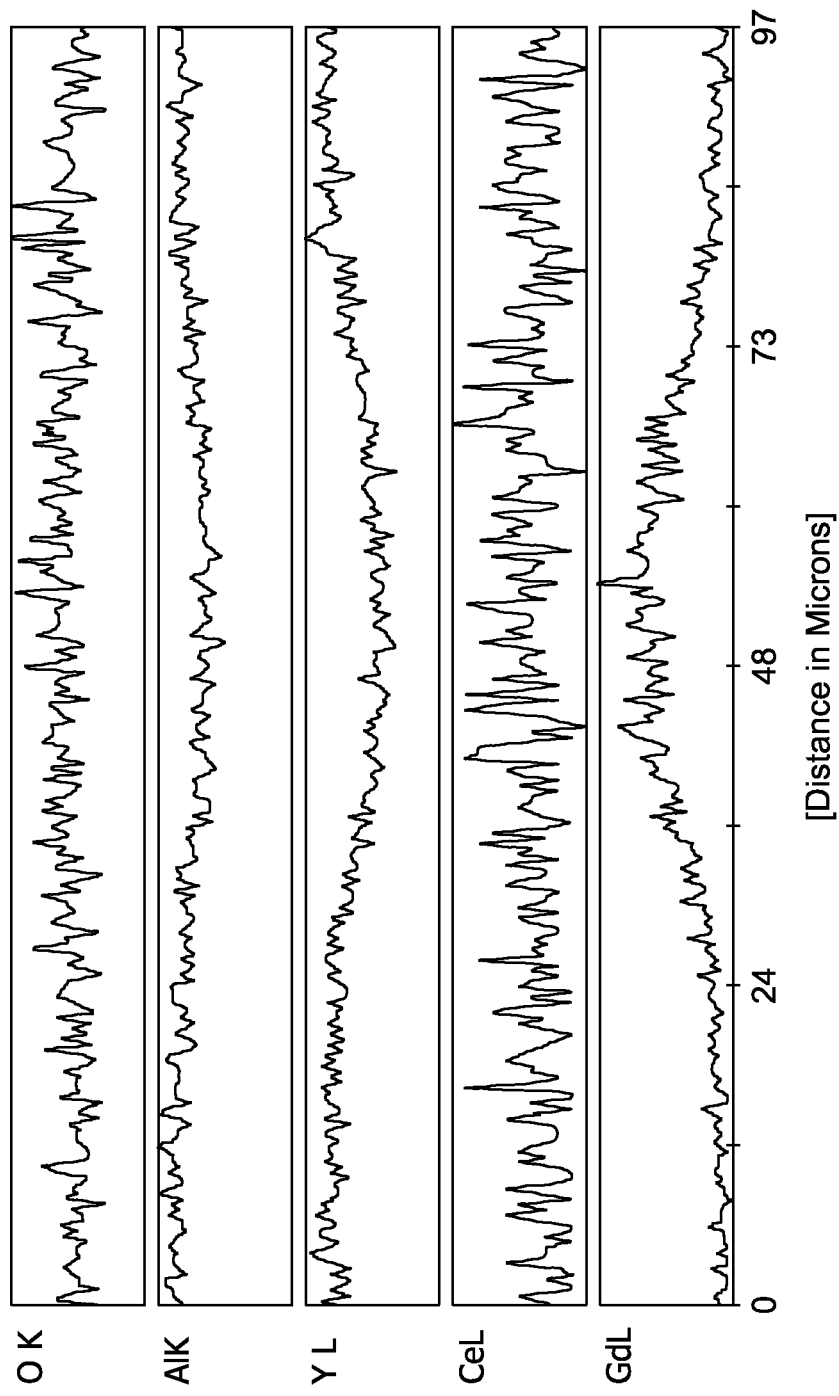
FIG. 20 shows SEM-EDX data for the ceramic body prepared in Example 1 from an assembly having a co-doped layer with $(Y_{0.635}Ce_{0.015}Gd_{0.35})_3Al_5O_{12}$ interposed between two $Y_3Al_5O_{12}$ layers.

The ceramic body prepared in Example 1 was used for SEM-EDX characterization. The ceramic body sample was from an assembly having a co-doped layer with $(Y_{0.635}Ce_{0.015}Gd_{0.35})_3Al_5O_{12}$ interposed between two $Y_3Al_5O_{12}$ layers. The cross-section of the prepared ceramic sample was polished to get its inner portion exposed, and heated in a box furnace in air at about 1400 C. for 2 h for thermal etching and contamination removal. The treated cross-section was observed under SEM. With EDX attachment in the SEM, elemental line scans cross a certain distance on the cross-section were performed to obtain element profiles along the line, as shown in FIG. 20. The Ce dopant broadly diffused from the co-doped layer into adjacent layers. The Gd dopant was more constrained within the co-doped layer and exhibited a narrower distribution.

Example 5

Figure 21A:
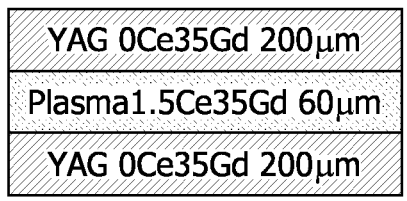
FIGS. 21A-C show examples of assemblies that were sintered to prepare ceramic bodies.
Figure 21B:
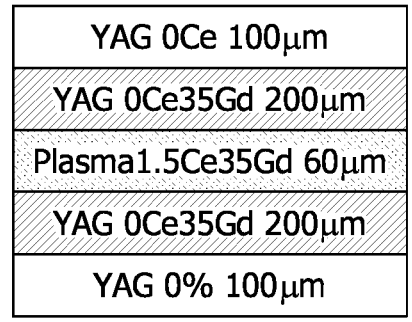

Two additional ceramic bodies were prepared using generally the same procedures as Example 1 except that the assemblies were configured as shown in FIGS. 21A-B. Each assembly includes a layer having $(Y_{0.65}Gd_{0.35})_3Al_5O_{12}$ on each side of the co-doped layer. These gadolinium-doped layers are anticipated to produce a broader Gd distribution in the ceramic body that can compensate for the limited Gd diffusion during sintering.

Example 6

Figure 21C:
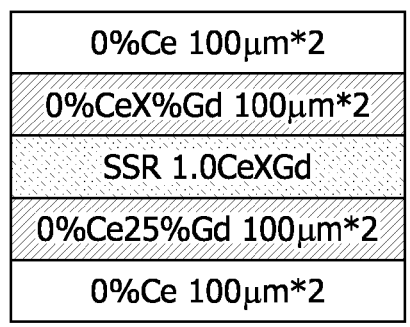

Four ceramic bodies were prepared using generally the same procedures as Example 1 except that the assemblies were configured as shown in FIG. 21C, where X is the amount of gadolinium doped within the co-doped layer and the two layers on each side of the co-doped layer. The tested values for X were 0 at %, 15 at %, 25 at %, and 35 at %. The co-doped layer was prepared from a solid state reaction and was about 78 μm thick. The other layers were about 200 μm thick each. The IQE and wavelength of peak emission were determined according to the procedures in Example 1.

Figure 22:
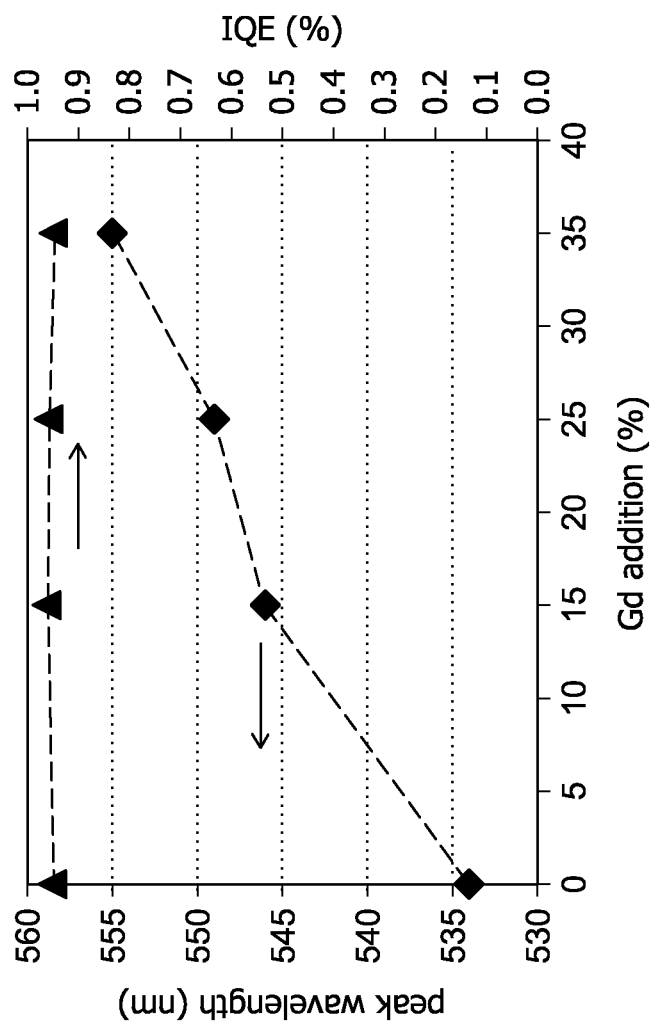
FIG. 22 shows the wavelength of peak emission and internal quantum efficiency (IQE) for ceramic bodies with various gadolinium concentrations.

The results are shown in TABLE 2 and FIG. 22. As can be seen from FIG. 22, the wavelength of peak emission could be adjusted within in the range of 534 nm to 555 nm by modifying the Gd concentration. Meanwhile, the IQE was maintained at 95% or more when adding up to 35 at % Gd.

TABLE 2

| Gadolinium Conc. (X) (atomic %) | Wavelength of Peak Emission (nm) | IQE (%) |
|---|---|---|
| 0 | 534 | 95 |
| 15 | 546 | 96 |
| 25 | 549 | 96 |
| 35 | 555 | 95 |

Example 7

Four groups of structures were prepared as shown in FIGS. 23A to 23D. The ceramic bodies were prepared using generally the same procedures as Example 1 except that the assemblies were configured as shown in FIGS. 23A to 23D, where Z is the amount of cerium, X is the amount of gadolinium, both doped within the co-doped layer and optionally within the layers on each side of the co-doped layer. T is the thickness of each layer. The tested values for Z were from 0.2 at % to 2 at % (0.2 at %, 1.0 at %, 1.5 at %, and 2.0 at %), X were from 5 at % to 50 at % (5 at %, 10 at %, 15 at %, 25 at %, 35 at % and 50 at %), and T were from 40 μm to 400 μm (40 μm, 200 μm and 400 μm). The optical properties for each ceramic body were tested using generally the same procedures as in Example 1. The results are shown in Table 3 below. All four groups of structures shifted the color points to the desired target color binning (generally red shift with CCy decreasing values and CCx increasing values) and they all maintained quantum efficiency (IQE) and thermal properties.

TABLE 3

Figure 23A:
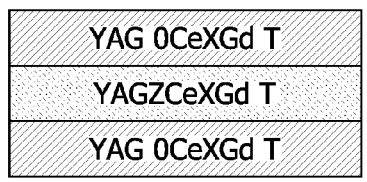
FIGS. 23A-D show examples of assemblies that were sintered to prepare ceramic bodies.
Figure 23B:
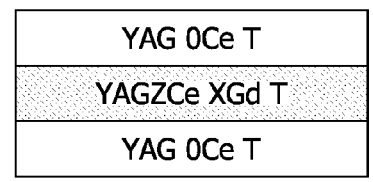
Figure 23C:
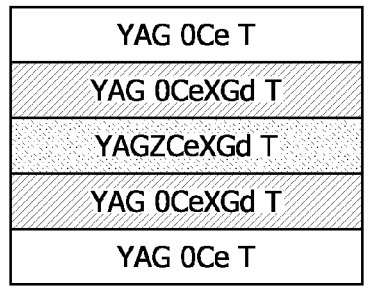
Figure 23D:
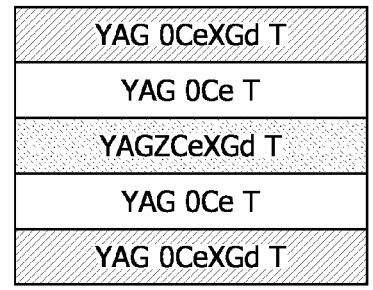

| Sample Case | X (at %) | Z (at %) | T (μm) | $CC_x$ | $CC_y$ | IQE |
|---|---|---|---|---|---|---|
| FIG. 23A Case 1 | 15 | 0.2 | 40 | 0.330 | 0.375 | ~90% |
| FIG. 23A Case 2 | 25 | 1.0 | 200 | 0.338 | 0.354 | ~80% |
| FIG. 23A Case 3 | 35 | 1.5 | 400 | 0.347 | 0.335 | ~75% |
| FIG. 23B Case 1 | 5 | 0.2 | 40 | 0.307 | 0.364 | ~95% |
| FIG. 23B Case 2 | 20 | 1.0 | 200 | 0.310 | 0.362 | ~92% |
| FIG. 23B Case 3 | 35 | 1.5 | 400 | 0.316 | 0.347 | ~95% |
| FIG. 23C Case 1 | 15 | 0.2 | 40 | 0.309 | 0.345 | ~95% |
| FIG. 23C Case 2 | 25 | 1.0 | 200 | 0.317 | 0.328 | ~95% |
| FIG. 23C Case 3 | 35 | 1.5 | 400 | 0.326 | 0.311 | ~94% |
| FIG. 23D Case 1 | 20 | 0.2 | 40 | 0.315 | 0.358 | ~90% |
| FIG. 23D Case 2 | 35 | 1.0 | 200 | 0.321 | 0.347 | ~85% |
| FIG. 23D Case 3 | 50 | 2.0 | 400 | 0.324 | 0.340 | ~80% |

What is claimed is:

1. A thermally stable ceramic body comprising an emissive layer, wherein said emissive layer comprises:
   a compound represented by the formula $(A_{1-x-z}Gd_xD_z)_3B_5O_{12}$, wherein:
   D is a first dopant selected from the group consisting of Nd, Er, Eu, Mn, Cr, Yb, Sm, Tb, Ce, Pr, Dy, Ho, Lu and combinations thereof;
   A is selected from the group consisting of Y, Lu, Ca, La, Tb, and combinations thereof;
   B is selected from the group consisting of Al, Mg, Si, Ga, and In;
   x is in the range of about 0.20 to about 0.80;
   z is in the range of about 0.001 to about 0.10;
   a first dopant concentration gradient along a thickness of the emissive layer, and
   a Gd concentration gradient along the thickness of the emissive layer.

2. The ceramic body of claim 1, wherein D comprises Ce.

3. The ceramic body of claim 2, wherein D is Ce.

4. The ceramic body of claim 1, wherein A is Y.

5. The ceramic body of claim 1, wherein B is Al.

6. The ceramic body of claim 1, wherein the ceramic body exhibits a thermal conductivity of at least 8 W/mK.

7. The ceramic body of claim 1, wherein the first dopant concentration gradient comprises a maximum first dopant concentration at or near the center along the thickness of the emissive layer.

8. The ceramic body of claim 1, wherein the first dopant concentration gradient comprises a maximum first dopant concentration at or near a surface along the thickness of the emissive layer.

9. The ceramic body of claim 1, wherein the first dopant concentration gradient is broader relative to the Gd concentration gradient.

10. The ceramic body of claim 1, wherein the Gd concentration gradient comprises a maximum Gd concentration at or near the maximum first dopant concentration along the thickness of the emissive layer.

11. A method of forming a thermally stable ceramic body comprising sintering an assembly, wherein the assembly comprises:
   a co-doped layer having a thickness in the range of about 10 μm to about 400 μm, wherein the co-doped layer comprises:
      yttrium aluminum garnet (YAG), a YAG precursor, or combination thereof;
      a first dopant selected from the group consisting of Nd, Er, Eu, Mn, Cr, Yb, Sm, Tb, Ce, Pr, Dy, Ho, Lu and combinations thereof; and
      about 20 at % to about 80 at % Gd relative to the amount of yttrium component in YAG, an equivalent amount of YAG precursor, or a combination thereof; and
   a first layer having a thickness in the range of about 40 μm to about 800 μm disposed on one side of the doped layer, wherein the first layer comprises YAG, a YAG precursor, or combination thereof, wherein the first layer is substantially free of the first dopant.

12. The method of claim 11, wherein the co-doped layer is disposed between the first layer and a second layer, the second layer comprising YAG, a YAG precursor, or combination thereof, wherein the second layer is substantially free of the first dopant, and wherein the first and second layers each independently have a thickness in the range of about 40 μm to about 400 μm.

13. The method of claim 12, wherein the second layer further comprises Gd.

14. The method of claim 13, wherein the second layer comprises about 20 at % to about 80 at % Gd.

15. The method of claim 11, wherein the co-doped layer comprises about 0.1 at % to about 10 at % first dopant.

16. The method of claim 11, wherein the first dopant is Ce.

17. The method of claim 11, wherein sintering said assembly comprises heating the assembly at a temperature in the range of about 1000° C. to about 1900° C. for at least about 2 hrs.

18. The method of claim 11, wherein at least about 30% of the first dopant in the co-doped layer diffuses out of the co-doped layer during said process.

19. The ceramic body made by the method of claim 11.

20. A lighting apparatus comprising:
   a light source configured to emit blue radiation; and
   the ceramic body of claim 1, wherein the ceramic body is configured to receive at a least a portion of the blue radiation.

21. A method of producing light comprising exposing the ceramic body of claim 1 to a blue radiation.

* * * * *